(12) United States Patent
Booth, Jr. et al.

(10) Patent No.: US 7,700,466 B2
(45) Date of Patent: Apr. 20, 2010

(54) TUNNELING EFFECT TRANSISTOR WITH SELF-ALIGNED GATE

(75) Inventors: Roger A. Booth, Jr., Wappingers Falls, NY (US); Kangguo Cheng, Beacon, NY (US); Jack A. Mandelman, Flat Rock, NC (US)

(73) Assignee: International Business Machines Corporation, Armonk, NY (US)

( * ) Notice: Subject to any disclaimer, the term of this patent is extended or adjusted under 35 U.S.C. 154(b) by 150 days.

(21) Appl. No.: 11/828,740

(22) Filed: Jul. 26, 2007

(65) Prior Publication Data

US 2009/0026491 A1    Jan. 29, 2009

(51) Int. Cl.
*H01L 21/425*  (2006.01)
*H01L 21/76*  (2006.01)
*H01L 21/20*  (2006.01)
*H01L 21/36*  (2006.01)
*H01L 21/3205*  (2006.01)
*H01L 21/4763*  (2006.01)
*H01L 21/302*  (2006.01)
*H01L 21/461*  (2006.01)

(52) U.S. Cl. ............... 438/517; 257/105; 257/E29.195; 257/E29.339; 257/E21.353; 257/E21.362; 438/400; 438/479; 438/585; 438/712; 438/926; 438/979

(58) Field of Classification Search .................. None
See application file for complete search history.

(56) References Cited

U.S. PATENT DOCUMENTS 6,294,412 B1 * 9/2001 Krivokapic ................. 438/155

| | | | |
|---|---|---|---|
| 6,617,643 B1 | 9/2003 | Goodwin-Johansson | |
| 2002/0063288 A1* | 5/2002 | Maciejewski et al. | ........ 257/350 |

OTHER PUBLICATIONS

Song, Seung-Hwan, et al., "Analytical Modeling of Field-Inducing Interband Tunneling-Effect Transistors and Its Application" IEEE Transactions on Nanotechnology, vol. 5, No. 3, May 2006, pp. 192-200.
Zhang, Wei E., et al., "Design and Modeling of a New Silicon-Based Tunneling Field-Effect Transistor" IEEE Transactions on Electron Devices, vol. 43, No. 9, Sep. 1996, pp. 1441-1447.
Bhuwalka, Krishna K., et al., "Scaling the Vertical Tunnel FET With Tunnel Bandgap Modulation and Gate Workfunction Engineering" IEEE Transactions on Electron Devices, vol. 52, No. 5, May 2005.

* cited by examiner

*Primary Examiner*—Andy Huynh
*Assistant Examiner*—Hoang-Quan T Ho
(74) *Attorney, Agent, or Firm*—Scully, Scott, Murphy & Presser, P.C.; H. Daniel Schnumann

(57) ABSTRACT

In one embodiment, a mandrel and an outer dummy spacer may be employed to form a first conductivity type region. The mandrel is removed to form a recessed region wherein a second conductivity type region is formed. In another embodiment, a mandrel is removed from within shallow trench isolation to form a recessed region, in which an inner dummy spacer is formed. A first conductivity type region and a second conductivity region are formed within the remainder of the recessed region. An anneal is performed so that the first conductivity type region and the second conductivity type region abut each other by diffusion. A gate electrode is formed in self-alignment to the p-n junction between the first and second conductivity regions. The p-n junction controlled by the gate electrode, which may be sublithographic, constitutes an inventive tunneling effect transistor.

5 Claims, 36 Drawing Sheets

TUNNELING EFFECT TRANSISTOR WITH SELF-ALIGNED GATE

FIELD OF THE INVENTION

The present invention relates to semiconductor devices, and particularly to tunneling effect transistor structures having a self-aligned gate and methods of manufacturing the same.

BACKGROUND OF THE INVENTION

A tunneling effect transistor is essentially a gated tunnel diode. The tunneling effect transistor is of interest for future semiconductor systems because of its steep subthreshold voltage slope. Thus, the ratio of on-current to off-current may be higher than conventional field effect transistors in low voltage operations, for example, at or below 1.0V.

While demonstrating such favorable device characteristics, currently known tunneling effect transistors are not suitable for integration into practical products due to low drive current per unit area compared with conventional field effect transistors. In general, prior art tunneling effect transistors do not provide self-alignment, which results in a large footprint on a substrate area. Further, the large footprint is unavoidably associated with a large parasitic capacitance, further degrading device performance as an electronic switch.

U.S. Pat. No. 6,617,643 to Goodwin-Johansson discloses a three-terminal tunneling device. In addition to requiring epitaxy of a silicon layer that adds to processing complexity, this prior art structure discloses a p+ doped region on one side of a gate and an n+ doped region on the other side of the gate. This requires a gate length greater than the overlay tolerance of block masks that are employed during masked ion implantation steps. Thus, the gate cannot have a sublithographic length, which becomes a limiting factor in scaling this prior art device. Further, reduction of input capacitance of this prior art device is necessarily limited by the relatively large physical size.

Song et al., "Analytical Modeling of Field-Induced Interband Tunneling-Effect Transistors and Its Application," IEEE Transactions on Nanotechnology, Vol. 5, No. 3, May 2006, pp. 192-200 discloses a variant of a conventional field effect transistor having a heavily doped channel that produces interband tunneling during operation. The gate is formed by conventional lithographic means, and consequently, has a lithographic length. Thus, the size of this device is about the same as conventional field effect transistors.

Zhang et al., "Design and Modeling of a New Silicon-Based Tunneling Field Effect Transistor," IEEE Transactions on Electron Devices, Vol. 43, No. 9, September 1996, pp. 1441-1447 discloses a vertical tunneling field effect transistor. However, this prior art structure requires many epitaxial silicon deposition steps, which is difficult to incorporate into standard complementary metal oxide semiconductor (CMOS) processing steps.

Bhuwalka et al., "Scaling the Vertical Tunnel FET with Tunnel Bandgap Modulation and Gate Workfunction Engineering," IEEE Transactions on Electron Devices, Vol. 52, No. 5, May 2005, discloses a vertical tunneling transistor structure having many heterojunctions. Manufacturing of this structure requires many epitaxial silicon deposition steps, which may not be easily integrated into standard CMOS processing sequences.

In view of the above, there exists a need for a self-aligned tunneling effect transistor having a small footprint and small parasitic capacitance, and methods of manufacturing the same.

Further, there exists a need for a self-aligned tunneling effect transistor having a sublithographic gate length, and methods of manufacturing the same.

In addition, there exists a need for a self-aligned tunneling effect transistor that may be manufactured by processing steps that are easily integrated into a standard CMOS processing sequence.

SUMMARY OF THE INVENTION

The present invention addresses the needs described above by providing tunneling effect transistor structures having a self-aligned gate with a sublithographic length, and methods of manufacturing the same.

In one embodiment of the present invention, a mandrel and an outer dummy spacer located thereupon and having a sublithographic width are formed at a gate level on a semiconductor region of a semiconductor structure. Dopants of a first conductivity type are implanted into exposed portions of the semiconductor region to form a first conductivity type region. At least one planarization dielectric layer is deposited and planarized. The mandrel is removed to form a recessed region having an exposed surface of the semiconductor region, and dopants of a second conductivity type are implanted into the semiconductor region underneath the exposed portion to form a second conductivity type region. An anneal is performed so that the first conductivity type region and the second conductivity type region abut each other by diffusion. At least one replacement dielectric layer is formed within the recessed region and planarized. The outer dummy spacer is removed to form a trench surrounded by the at least one planarization dielectric layer and the at least one replacement dielectric layer. A portion of the first conductivity type region and a portion of the second conductivity type as well as the interface between the two regions are exposed. A gate electrode comprising a gate dielectric and a gate conductor is formed within the trench. Portions of the first conductivity region and the second conductivity region are exposed, and metal semiconductor alloys may be formed on the first and second conductivity regions and the gate conductor. A first inventive tunneling effect transistor comprises a p-n junction self-aligned to and controlled by the gate electrode. The gate electrode may have a sublithographic length.

In another embodiment, a mandrel layer is formed on a semiconductor region of a semiconductor substrate. A dielectric material is deposited and planarized to form shallow trench isolation having a top surface which is substantially flush with a top surface of the mandrel layer. The remaining portion of the mandrel layer comprises a mandrel preferably having a width at or near a lithographic minimum dimension. The mandrel is removed to form a recessed region. An inner dummy spacer is formed around the periphery of the recessed region. Dopants of a first conductivity type are implanted into one side of an exposed portion of the semiconductor region to form a first conductivity type region. Dopants of a second conductivity type are implanted into the opposite side of the exposed portion of the semiconductor region to form a second conductivity region. An anneal is performed so that the first conductivity type region and the second conductivity type region abut each other by diffusion. A gate spacer is formed on the inner sidewalls of the inner dummy spacer by deposition and reactive ion etch of a dielectric material layer. A gate electrode comprising a gate dielectric and a gate conductor is formed within the remaining portion of the recessed region.

The inner dummy spacer is removed to exposed portions of the first conductivity region and the second conductivity region, and metal semiconductor alloys may be formed on the first and second conductivity regions and the gate conductor. A second inventive tunneling effect transistor comprises a p-n junction self-aligned to and controlled by the gate electrode. The gate electrode may have a sublithographic length.

According to an aspect of the present invention, a semiconductor structure is provided, which comprises:

a first conductivity type region located in a semiconductor substrate and comprising a semiconductor material having a first conductivity type doping;

a second conductivity type region located in the semiconductor substrate, laterally abutting the first conductivity type region, and comprising the semiconductor material having a second conductivity type doping, wherein the second conductivity type doping is the opposite of the first conductivity type doping; and a gate electrode comprising a gate dielectric and a gate conductor, wherein the gate dielectric vertically abuts the first conductivity type region, the second conductivity type region, and an interface therebetween.

In a first embodiment, the gate electrode has a sublithographic length in a direction perpendicular to the interface, wherein the sublithographic length is less than a minimum dimension that is printable with lithographic techniques.

In a second embodiment, the sum of a first overlap length between the gate electrode and the first conductivity type region and a second overlap length between the gate electrode and the second conductivity type region is the same as the sublithographic length.

In a third embodiment, the first overlap length and the second overlap length are substantially equal.

In a fourth embodiment, the gate electrode is self-aligned to the interface.

In a fifth embodiment, the semiconductor structure further comprises:

a first dielectric spacer laterally abutting one sidewall of the gate electrode; and a second dielectric spacer laterally abutting another sidewall of the gate electrode and disjoined from the gate electrode, wherein the one sidewall and the another sidewall are substantially parallel to each other.

In a sixth embodiment, the first dielectric spacer has a first width and the second dielectric spacer has a second width, wherein the first width and the second width are different.

In a seventh embodiment, the first dielectric spacer comprises a first dielectric material and the second dielectric spacer comprises a dielectric material, wherein the first dielectric material and the second dielectric material are different.

In an eighth embodiment, the semiconductor structure further comprises a dielectric spacer laterally abutting all sidewall surfaces of the gate electrode and is topologically homeomorphic to a torus.

In a ninth embodiment, the semiconductor structure further comprises:

a first metal semiconductor alloy abutting the first conductivity region;

a second metal semiconductor alloy abutting the second conductivity region;

a first metal contact via contacting the first metal semiconductor alloy; and a second metal contact via contacting the second metal semiconductor alloy.

In a tenth embodiment, the first dielectric spacer comprises a stack of a first planarization dielectric layer and a second planarization dielectric layer, and the second dielectric spacer comprises a stack of a first replacement dielectric layer and a second replacement dielectric layer, and the first planarization dielectric layer and the first replacement dielectric layer comprise silicon nitride, and each of the second planarization dielectric layer and the second replacement dielectric layer comprises one of tetra-ethyl-ortho-silicate (TEOS) oxide, undoped silicate glass, borosilicate glass, phosphosilicate glass, fluorosilicate glass, and borophosphosilicate glass, and spin-on low-k dielectric material.

In an eleventh embodiment, the semiconductor structure further comprises shallow trench isolation laterally enclosing the first conductivity region and the second conductivity region.

In a twelfth embodiment, the semiconductor substrate is a semiconductor-on-insulator (SOI) substrate comprising a handle substrate and a buried insulator layer, and the first conductivity region and the second conductivity region is electrically isolated from the handle substrate by the buried insulator layer.

In a thirteenth embodiment, the first metal semiconductor alloy laterally abuts a sidewall of the first conductivity region, and the second metal semiconductor alloy laterally abuts a sidewall of the second conductivity region.

In a fourteenth embodiment, the semiconductor structure further comprises a middle-of-line (MOL) dielectric layer abutting the buried insulator layer.

In a fifteenth embodiment, the first metal contact via directly contacts a sidewall of the first metal semiconductor alloy, and the second metal contact via directly contacts a sidewall of the second metal semiconductor alloy.

In a sixteenth embodiment, the first metal contact via and the second metal contact via directly contact the buried insulator layer.

In a seventeenth embodiment, the first semiconductor region and the second semiconductor region comprise a single crystalline semiconductor material.

In an eighteenth embodiment, the single crystalline semiconductor material is silicon.

In a nineteenth embodiment, the single crystalline semiconductor material is gallium arsenide.

In a twentieth embodiment, the first doping conductivity type region and the second doping conductivity type region have a doping concentration from about $1.0\times10^{18}/cm^3$ to about $3.0\times10^{21}/cm^3$, and preferably from about $3.0\times10^{19}/cm^3$ to about $1.0\times10^{21}/cm^3$.

According to another aspect of the present invention, a method of manufacturing a semiconductor structure is provided, which comprises:

forming a mandrel on a semiconductor region in a semiconductor substrate;

forming an outer dummy spacer on sidewalls of the mandrel, wherein a portion of the semiconductor region is located outside the mandrel and the outer dummy spacer;

forming a first conductivity type region in the portion of the semiconductor region;

removing the mandrel to form a recessed region and forming a second conductivity type region underneath the recessed region; and removing the outer dummy spacer and forming a gate electrode comprising a gate dielectric and a gate conductor directly on the first conductivity type region and the second conductivity type region.

In one embodiment, the method further comprises performing an anneal so that the first conductivity type region and the second conductivity type region abut each other by diffusion, wherein the gate electrode is self-aligned to an interface between the first conductivity type region and the second conductivity type region.

In another embodiment, a lateral thickness of the outer dummy spacer is a sublithographic dimension, and wherein a length of the gate electrode is another sublithographic dimension.

In yet another embodiment, the method further comprises:

forming at least one planarization dielectric layer on the first conductivity type region;

planarizing the at least one planarization dielectric layer;

forming at least one replacement dielectric layer on the second conductivity type region; and planarizing the at least one replacement dielectric layer.

In still another embodiment, the first dielectric spacer comprises a stack of a first planarization dielectric layer and a second planarization dielectric layer, and the second dielectric spacer comprises a stack of a first replacement dielectric layer and a second replacement dielectric layer, and wherein a vertical portion of the first planarization dielectric layer and a vertical portion of the first replacement dielectric layer are removed after the removing of the outer dummy spacer and prior to the forming of the gate electrode.

According to yet another aspect of the present invention, another method of forming a semiconductor structure is provided, which comprises:

forming a mandrel surrounded by shallow trench isolation on a semiconductor region in a semiconductor substrate;

removing the mandrel to form a recessed region and forming an inner dummy spacer at an inner periphery of the recessed region;

forming a first conductivity type region on one side of exposed portion of the semiconductor region within the recessed region by a first angled ion implantation of dopants of a first conductivity type;

forming a second conductivity type region one an opposite side of the exposed portion of the semiconductor region within the recessed region by a second angled ion implantation of dopants of a second conductivity type, wherein the second conductivity type is the opposite of the first conductivity type; and forming a gate electrode comprising a gate dielectric and a gate conductor directly on the first conductivity type region and the second conductivity type region.

In one embodiment, the method further comprises performing an anneal so that the first conductivity type region and the second conductivity type region abut each other by diffusion, wherein the gate electrode is self-aligned to an interface between the first conductivity type region and the second conductivity type region.

In another embodiment, the method further comprises:

forming a gate spacer on inner sidewalls of the inner dummy spacer prior to the forming of the gate electrode; and removing the inner dummy spacer after the forming of the gate electrode.

In yet another embodiment, a lateral thickness of the inner dummy spacer is a sublithographic dimension, and wherein a lateral thickness of the gate spacer is another sublithographic dimension, and wherein a length of the gate electrode is yet another sublithographic dimension.

In still another embodiment, the method further comprises forming a first metal semiconductor alloy on the first conductivity region and a second metal semiconductor alloy on the second conductivity region.

DETAILED DESCRIPTION OF THE INVENTION

Figure 1:
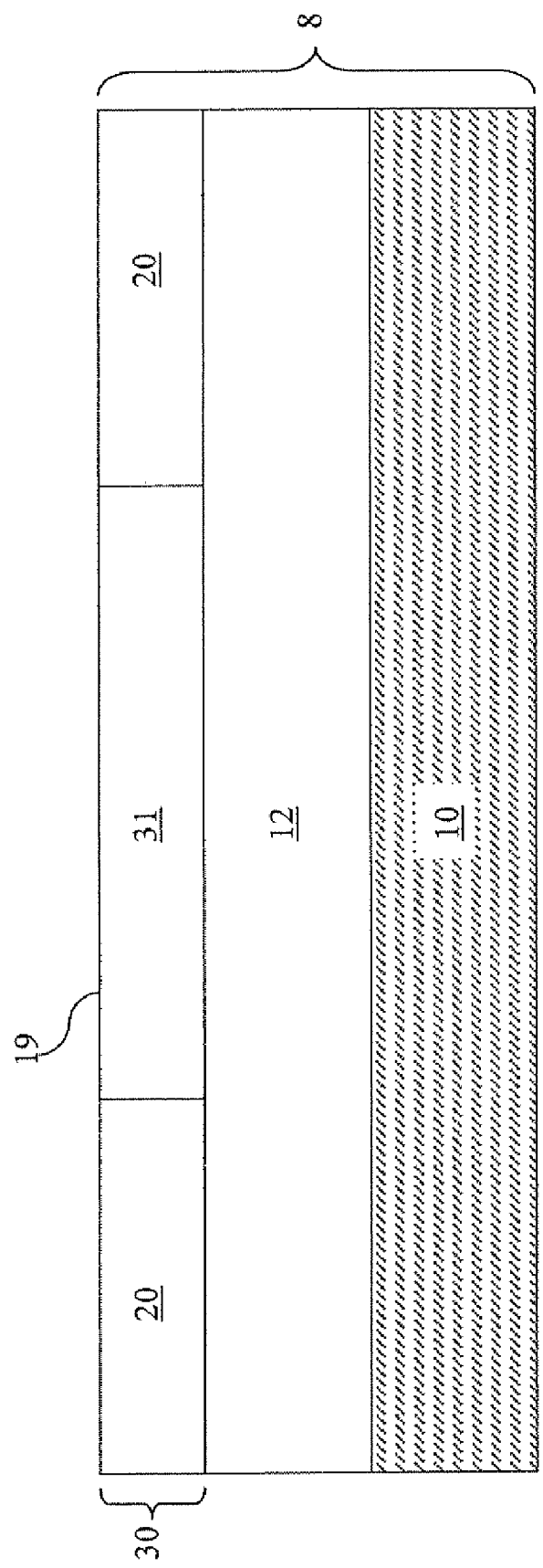
FIGS. 1, 2, 4-10, and 12-17 show sequential vertical cross-sectional views of a first exemplary semiconductor structure according to one embodiment of the present invention.

As stated above, the present invention relates to tunneling effect transistor structures having a self-aligned gate and methods of manufacturing the same, which are now described in detail with accompanying figures. It is noted that like and corresponding elements are referred to by like reference numerals.

Referring to FIG. 1, a first exemplary semiconductor structure according to one embodiment of the present invention comprises a semiconductor substrate 8 having a handle substrate 10, a buried insulator layer 12, and a top semiconductor layer 30. The top semiconductor layer 30 contains a semiconductor region 31 and shallow trench isolation 20. The thickness of the top semiconductor layer 30 may be from about 20 nm to about 300 nm, although lesser and greater thickness are herein contemplated also. Methods of forming the shallow trench isolation 20 which comprises a dielectric material are well known in the art. The shallow trench isolation 20 may comprise a dielectric oxide or a dielectric nitride such as silicon oxide or silicon nitride. In one embodiment, the shallow trench isolation 20 comprises silicon oxide.

The semiconductor region 31 comprises a semiconductor material. The semiconductor material may be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. In one embodiment, the semiconductor material comprises silicon. In another embodiment, the semiconductor material comprises gallium arsenide. Preferably, the semiconductor region is single crystalline, i.e., has the same crystallographic orientations throughout the volume of the semiconductor region 31.

The semiconductor substrate 8 may be a bulk substrate, a semiconductor-on-insulator (SOI) substrate, or a hybrid substrate. The semiconductor region 31 may have a built-in biaxial stress in the plane of the semiconductor region 31, i.e., in the plane perpendicular to the direction of the surface normal of a top surface 19 of the semiconductor region 31. While the present invention is described with an SOI substrate, implementation of the present invention on a bulk substrate or on a hybrid substrate is explicitly contemplated herein.

Figure 2:
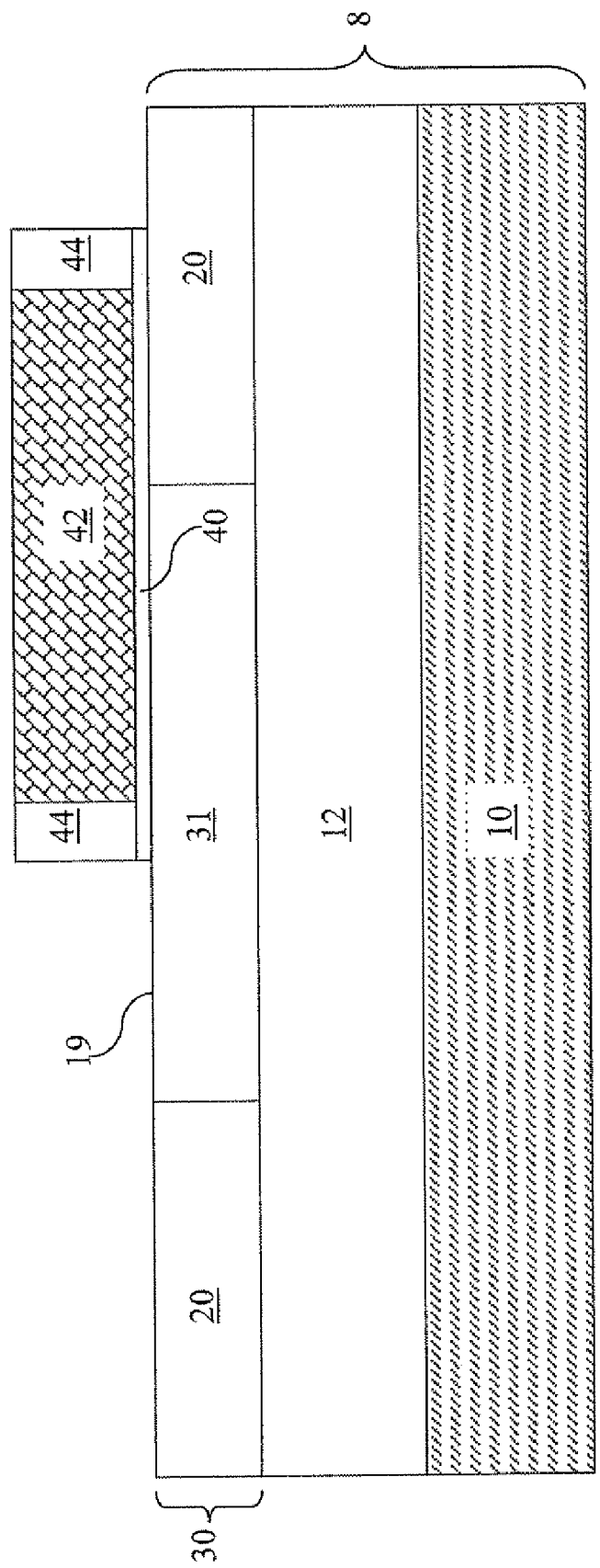
Figure 3:
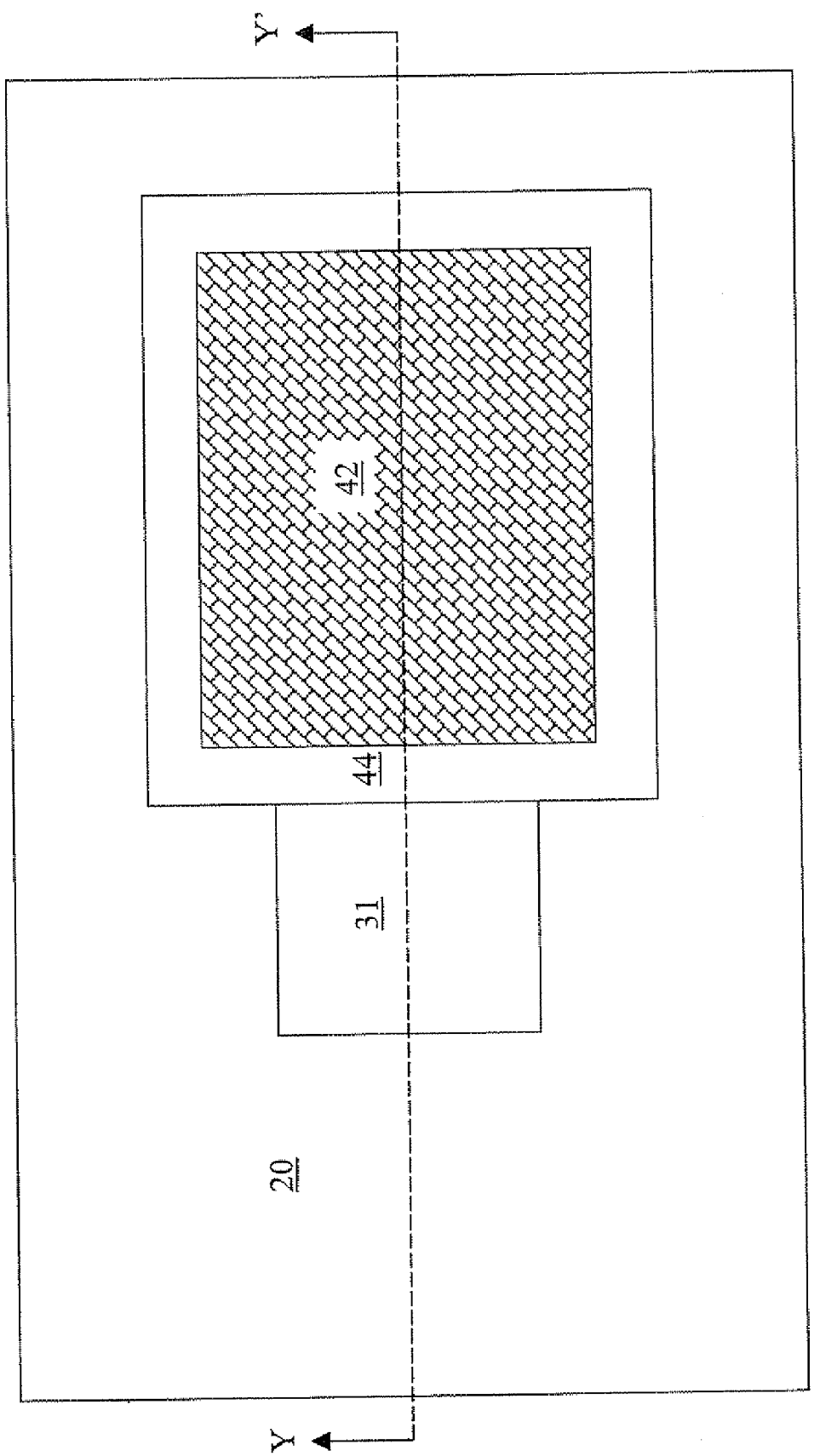
FIGS. 3, 11, and 18 are horizontal cross-sectional views of FIGS. 2, 10, and 17, respectively, along the plane X-X'. The vertical cross-sectional views of FIGS. 2, 10, and 17 correspond to the vertical plane Y-Y' in FIGS. 3, 11, and 18, respectively.

Referring to FIGS. 2 and 3, a sacrificial dielectric layer 40 and a mandrel 42 is formed on a top surface 19 of the semiconductor substrate 8. The mandrel 42 straddles the semiconductor region 31 and the shallow trench isolation 20. In other words, the mandrel 42 overlies a portion of the semiconductor region 31 and a portion of the shallow trench isolation 20. The sacrificial dielectric layer 40 may comprise an oxide such as thermally formed silicon oxide or a deposited chemical vapor deposition (CVD) oxide. While the sacrificial dielectric layer 40 is formed on a portion of the semiconductor region 31, the sacrificial dielectric layer 40 may, or may not be formed on the shallow trench isolation 20. The thickness of the sacrificial dielectric layer 40 may be from about 1 nm to about 20 nm, and typically from about 3 nm to about 12 nm.

The mandrel 42 may be formed, for example, by blanket deposition of a mandrel layer (not shown) followed by lithographic patterning and etching of the mandrel layer. The mandrel 42 may comprise a semiconductor material, a dielectric material, or a metal. In one embodiment, the mandrel 42 comprises an amorphous or polycrystalline silicon containing alloy such as polysilicon or silicon germanium carbon alloy. In another embodiment, the mandrel 42 comprises a spin-on low-k dielectric material that may be etched selective to conventional dielectric materials such as silicon oxide or silicon nitride. The thickness of the mandrel layer, and consequently, of the mandrel 42 may be from about 30 nm to about 150 nm, and preferably from about 50 nm to about 120 nm, although lesser and greater thicknesses are also contemplated herein.

An outer dummy spacer 44 is formed on the mandrel 42 by deposition of an outer dummy spacer layer (not shown), followed by an anisotropic reactive ion etch. The anisotropic ion etch may, or may not, be selective to the sacrificial dielectric layer 40. The outer dummy spacer 44 comprises a different material than the mandrel 42 such that at least one etch chemistry allows selective removal of the mandrel 42 relative to the outer dummy spacer 44 in a subsequent processing step. In one embodiment, the outer dummy spacer 44 comprises a silicon oxide such as tetra-ethyl-ortho-silicate (TEOS) oxide, undoped silicate glass, borosilicate glass, phosphosilicate glass, fluorosilicate glass, and borophosphosilicate glass, and spin-on low-k dielectric material. The outer dummy spacer 44 is formed on "outer" sidewalls of the mandrel 42. Thus, the outer dummy spacer 44 is inherently topologically homeomorphic to a torus, i.e., may be continually stretched and bent in a continual manner without forming a singularity such as piercing, cutting, or joining. In other words, the shape of the outer dummy spacer 44 is a three-dimensional object of genus 1, or has one topological "handle." The lateral width of the outer dummy spacer 44 may be, and preferably is, sublithographic, i.e., less than a minimal dimensions that is printable with lithographic techniques. For example, the lateral width of the outer dummy spacer 44 may be from about 2 nm to about 50 nm, and preferably from about 5 nm to about 40 nm.

While a "lithographic minimum dimension" and a "sublithographic dimension" are defined only in relation to a lithography tool and normally changes from generation to generation of semiconductor technology, it is understood that the lithographic minimum dimension and the sublithographic dimension are to be defined in relation to the best performance of lithography tools available at the time of semiconductor manufacturing. As of 2007, the lithographic minimum dimension is about 50 nm and is expected to shrink in the future.

Figure 4:
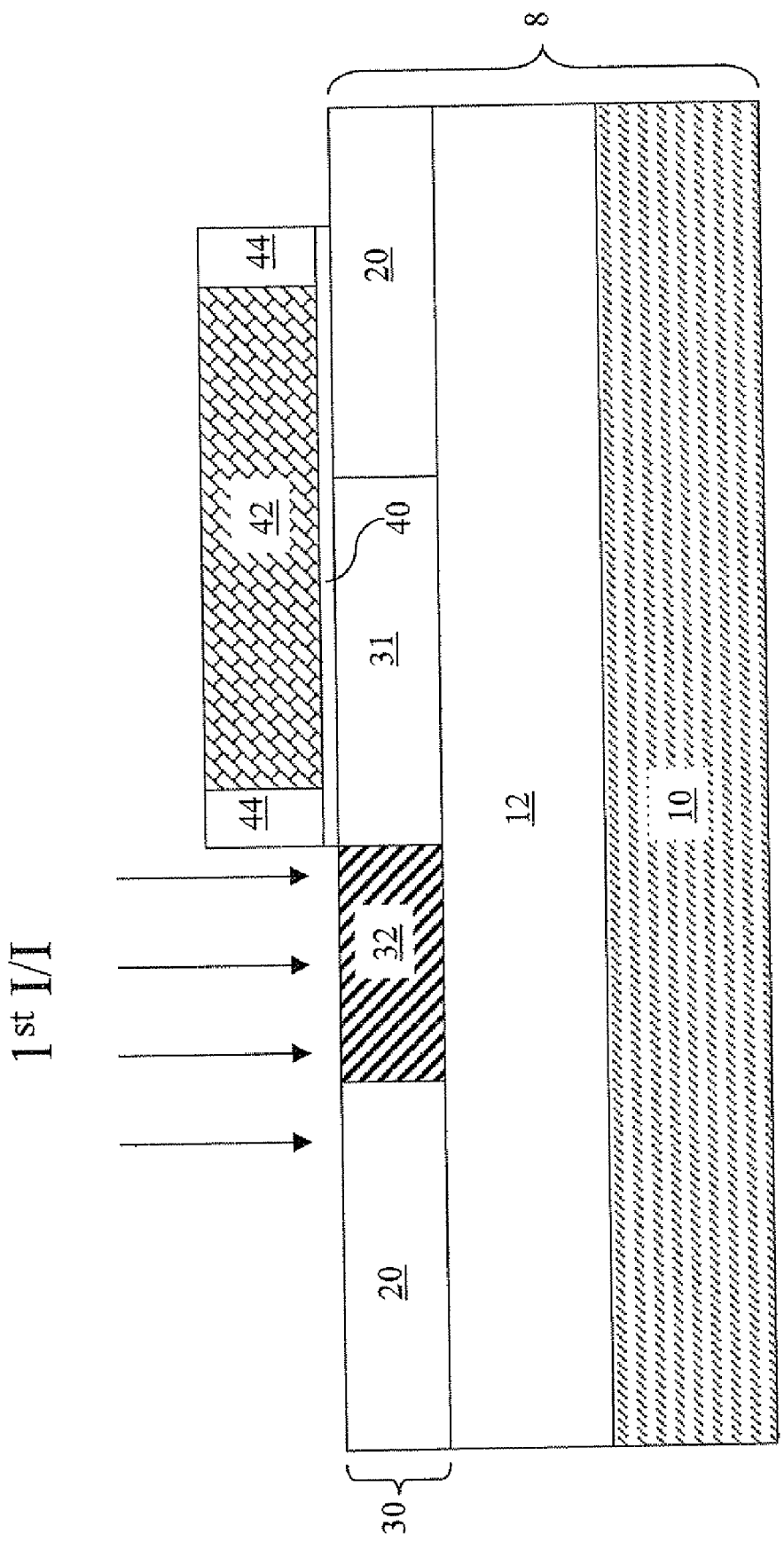

Referring to FIG. 4, a first ion implantation is performed into an exposed portion of the semiconductor region 31 employing the mandrel 42 and the outer dummy spacer 44 as an implantation block mask. Dopant ions of a first conductivity type are implanted into the exposed portion of the semiconductor region 31 to form a first conductivity type region 32. The direction of the first ion implantation is shown with a set of arrows labeled $1^{st}$ I/I. An angled first ion implantation is herein contemplated also. The first conductivity type may be p-type, and ions of the first conductivity type may comprise at least one of B, Ga, and In. Alternatively, the first conductivity type may be n-type, and ions of the first conductivity type may comprise at least one of P, As, and Sb. The edge of the first conductivity type region 32 may substantially coincide with an outer edge of the outer dummy spacer 44. Preferably, the energy of the ion implantation is sufficient for the first conductivity type region 32 to reach a bottom surface of the semiconductor region 31. The size of the semiconductor region 31, which herein refers to the portion having the same composition as before the first ion implantation, is accordingly reduced with the formation of the first conductivity type region 32. The first conductivity type region 32 may have a doping concentration from about $1.0 \times 10^{18}/cm^3$ to about $3.0 \times 10^{21}/cm^3$, and preferably from about $3.0 \times 10^{19}/cm^3$ to about $1.0 \times 10^{21}/cm^3$.

Figure 5:
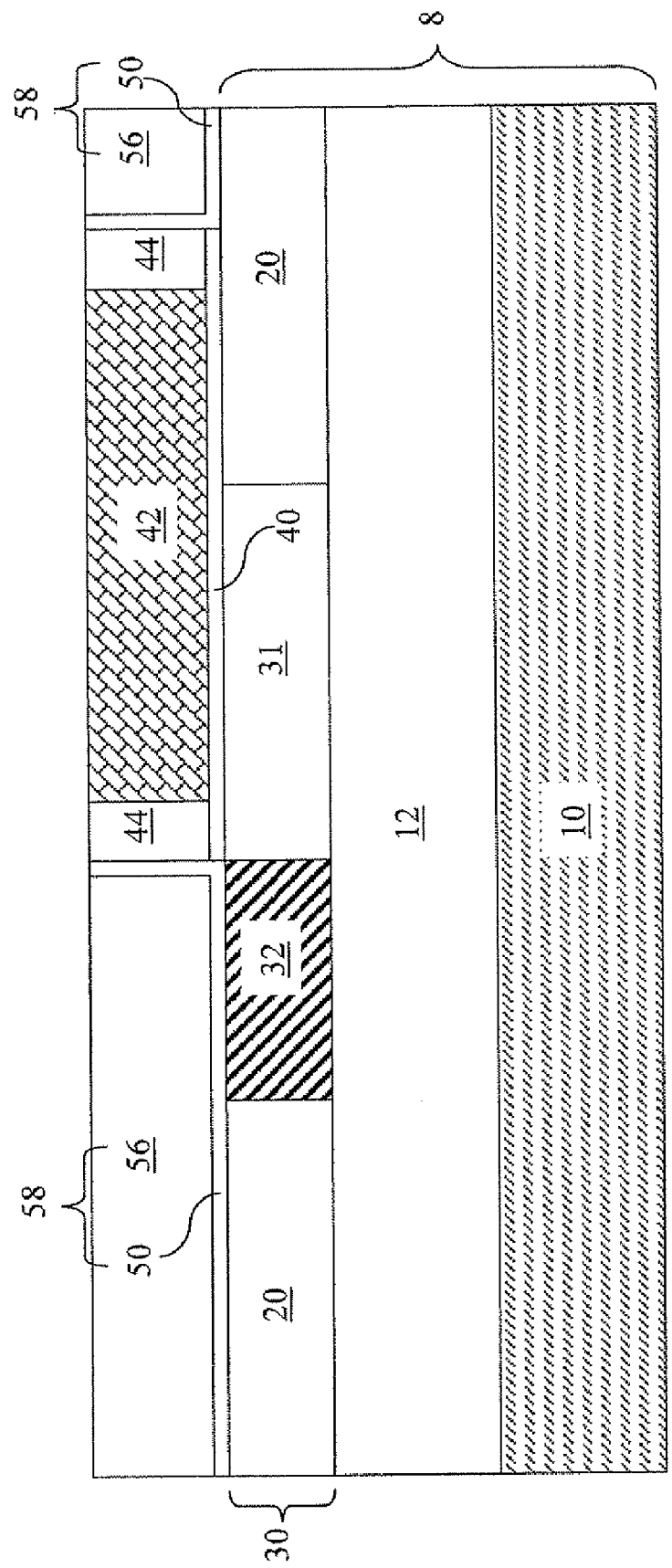

Referring to FIG. 5, at least one planarization dielectric layer 58 is deposited and planarized. The at least one planarization dielectric layer 58 may comprise a dielectric oxide or a dielectric nitride such as silicon oxide or silicon nitride. The planarization step may employ chemical mechanical polishing employing at least one of the mandrel 42 and the outer dummy spacer 44 as a stopping layer. In one embodiment, the at least one planarization dielectric layer 58 comprises a first planarization dielectric layer 50 and a second planarization dielectric layer 56 that are substantially conformally deposited on the exposed portions of the semiconductor substrate 8, the mandrel 42, and the outer dummy spacer 44. The first planarization dielectric layer 50 may be a silicon nitride layer having a thickness from about 2 nm to about 20 nm, and preferably from about 3 nm to about 10 nm. The second planarization dielectric layer 56 may be a silicon oxide layer having a thickness from about 30 nm to about 400 nm, and typically from about 50 nm to about 250 nm. The first planarization dielectric layer 50 may be employed as a stopping layer during the planarization step. Alternatively, the at least one planarization dielectric layer 58 may comprise a spin-on low-k dielectric material that is self-planarizing.

Figure 6:
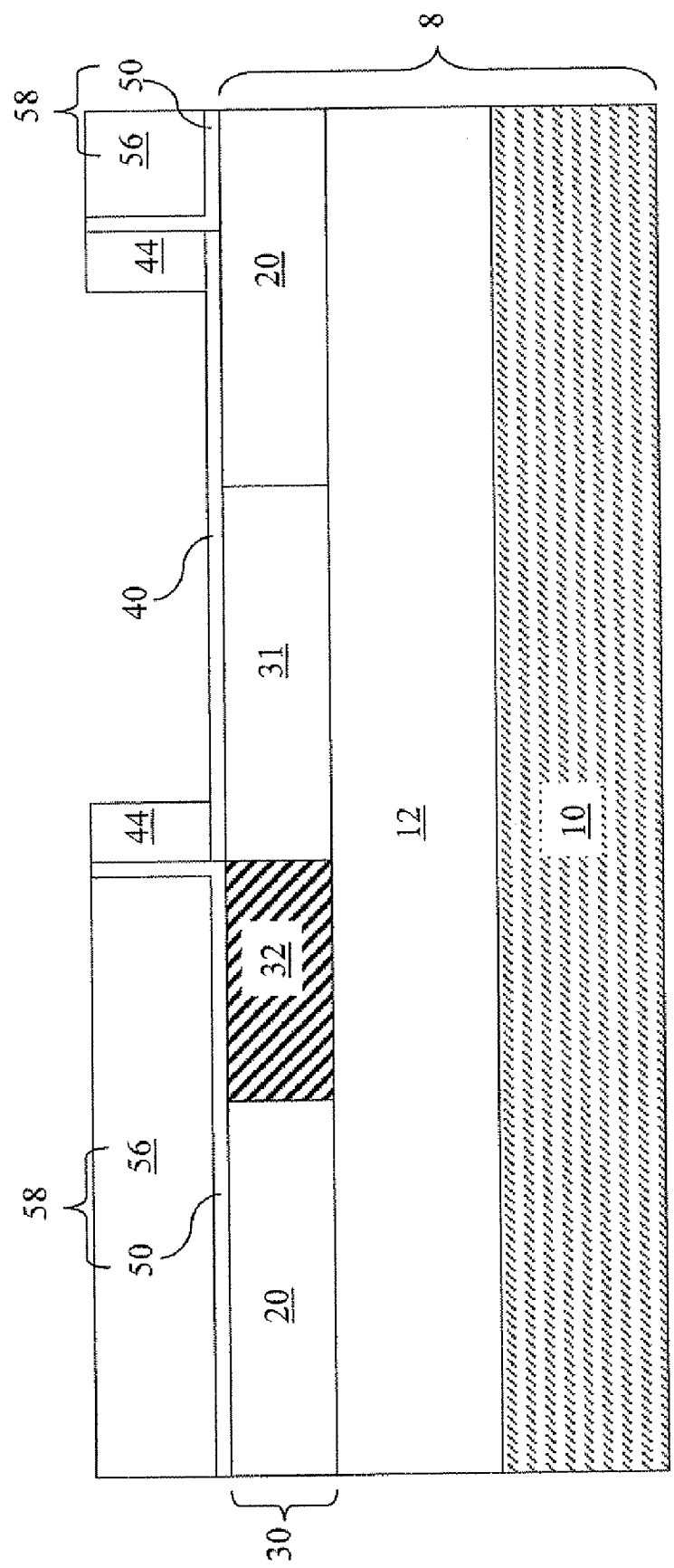

Referring to FIG. 6, the mandrel 42 is removed selective to the outer dummy spacer 44 and the at least one planarization dielectric layer 58. The mandrel 42 may be removed selective to the sacrificial dielectric layer 40, while removal processes that are not selective to the sacrificial dielectric layer 40 are also contemplated herein. A recessed region is formed in the space from which the mandrel 42 is removed.

Figure 7:
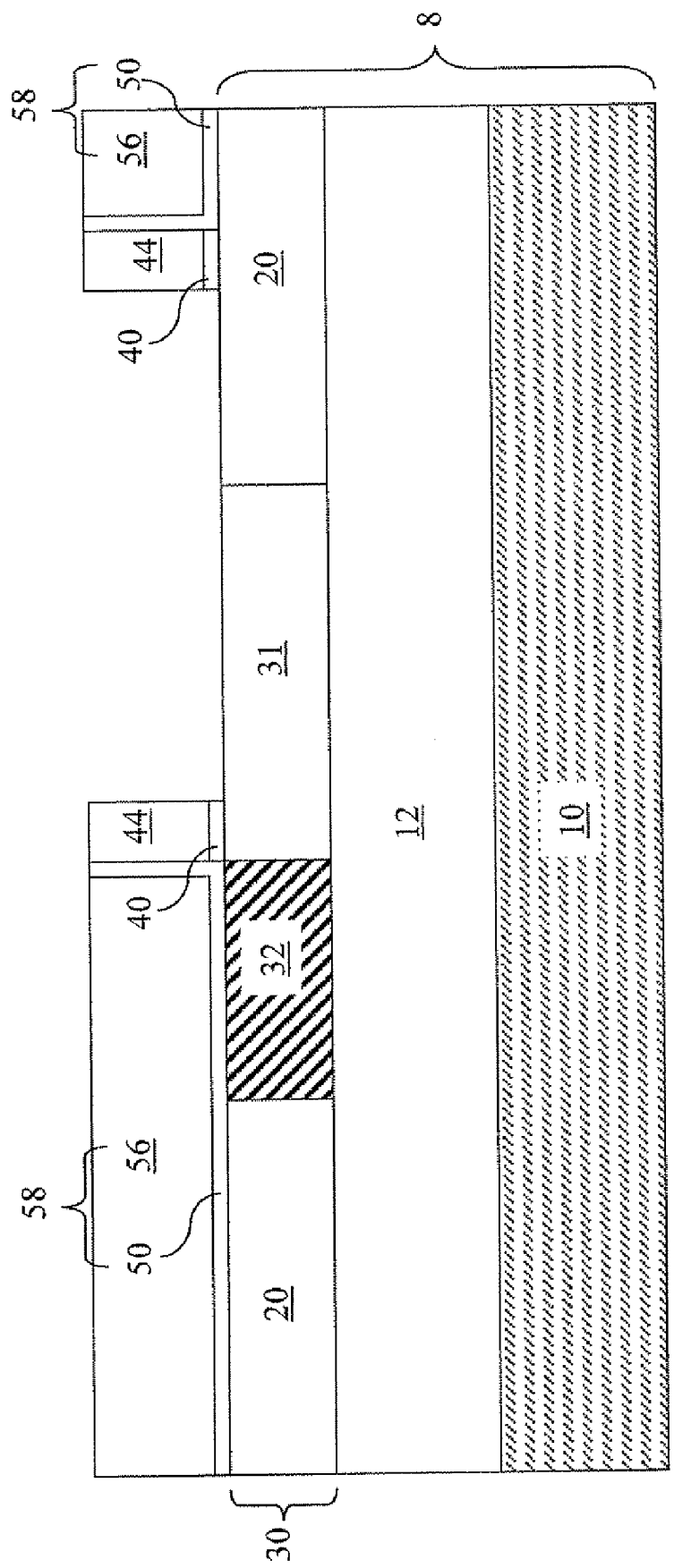

Referring to FIG. 7, exposed portions of the sacrificial dielectric layer 40 is removed, for example, by a wet etch or a reactive ion etch. In one embodiment, the sacrificial dielectric layer 40 comprises silicon oxide, and is removed by a hydrofluoric acid (HF) based wet etch.

Figure 8:
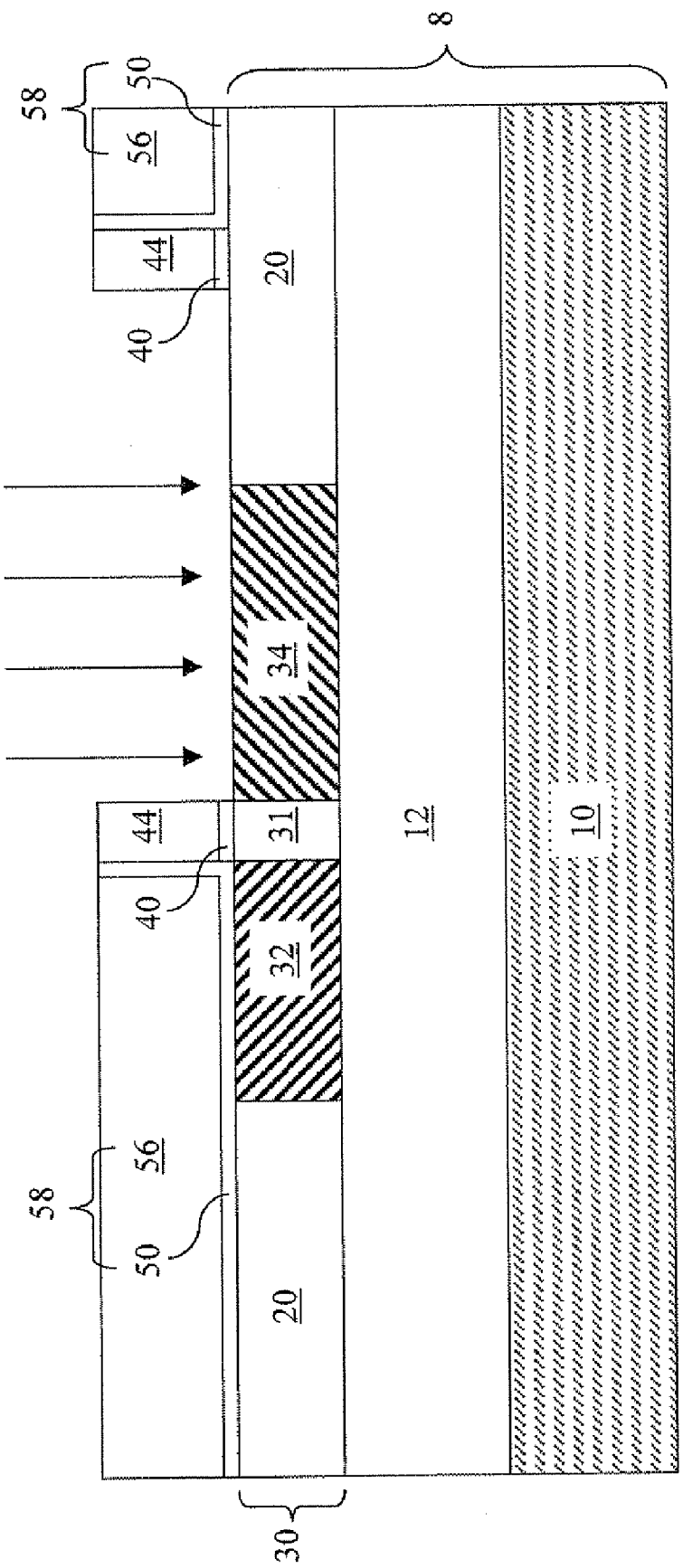

Referring to FIG. 8, a second ion implantation is performed into an exposed portion of the semiconductor region 31 employing the at least one planarization dielectric layer 58 and the outer dummy spacer 44 as an implantation block mask. Ions of a second conductivity type are implanted into the exposed portion of the semiconductor region 31 to form a second conductivity type region 34. The direction of the second ion implantation is shown with a set of arrows labeled $2^{nd}$ I/I. An angled second ion implantation is herein contemplated also. The second conductivity type is the opposite of the first conductivity type, i.e., if the first conductivity type is p-type, the second conductivity type is n-type and vice versa.

The edge of the second conductivity type region 34 may substantially coincide with an inner edge of the outer dummy spacer 44. As formed, the second conductivity type region 34 is separated from the first conductivity type region 32 by the lateral width of the outer dummy spacer 44, which may have a sublithographic dimension. Preferably, the energy of the ion implantation is sufficient for the second conductivity type region 34 to reach a bottom surface of the semiconductor region 31. The size of the semiconductor region 31, which herein refers to the portion having the same composition as before the second ion implantation, is accordingly reduced with the formation of the second conductivity type region 34. The second conductivity type region 34 may have a doping concentration from about $1.0 \times 10^{18}/cm^3$ to about $3.0 \times 10^{21}/cm^3$, and preferably from about $3.0 \times 10^9/cm^3$ to about $1.0 \times 10^{21}/cm^3$.

Figure 9:
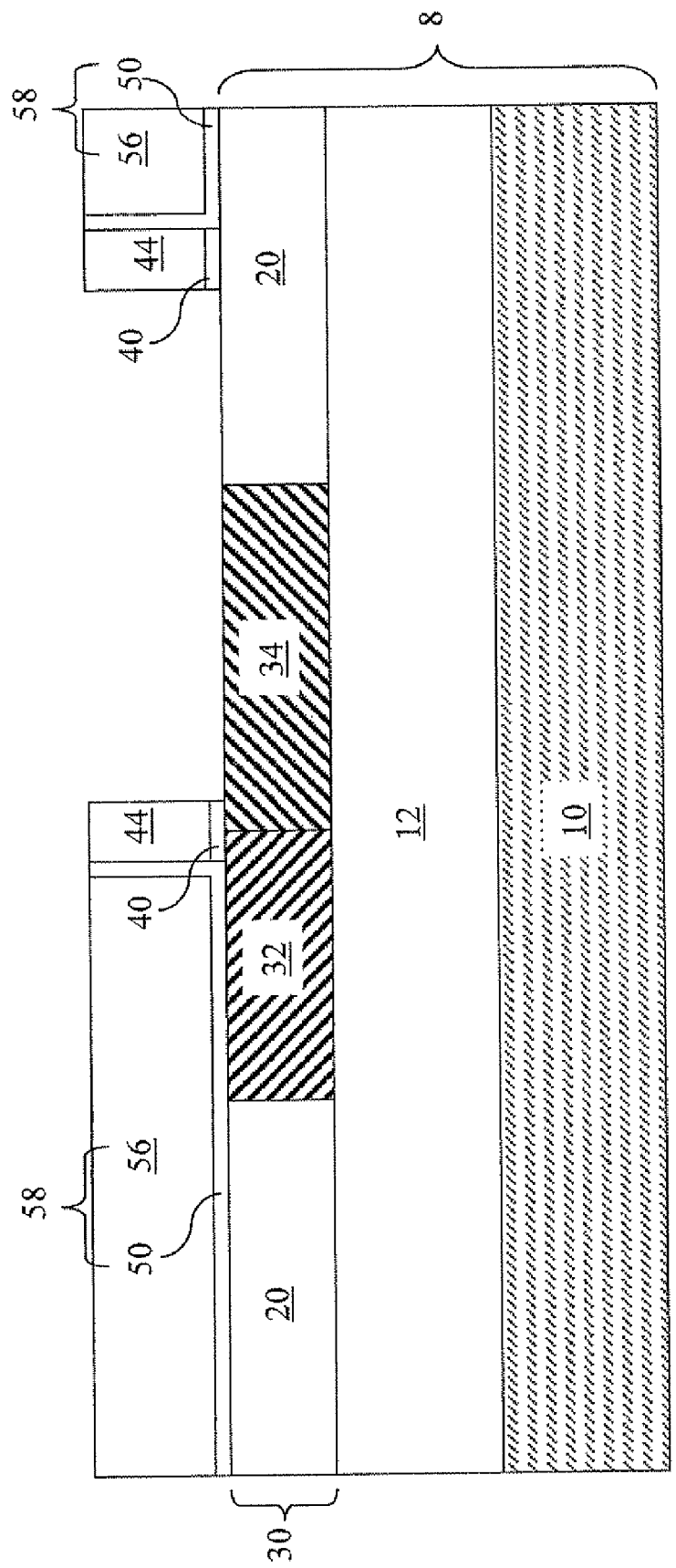

Referring to FIG. 9, an anneal is performed to diffuse the dopants in the first conductivity type region 32 and the second conductivity type region 34 as well as activating the implanted dopants and healing structural damages that may have been introduced during the first and second ion implantation steps. The temperature and duration of the anneal is selected such that diffusion lengths of the dopants in the first conductivity type region 32 and the second conductivity type region 34 are at least equal to one half of the lateral width of the outer dummy spacer 44. At the end of the anneal step, the first conductivity type region 32 laterally abuts the second conductivity type region 34. The doping concentrations of the first conductivity type region 32 and the second conductivity type region 34 are substantially on the same order of magnitude as prior to the anneal.

Figure 10:
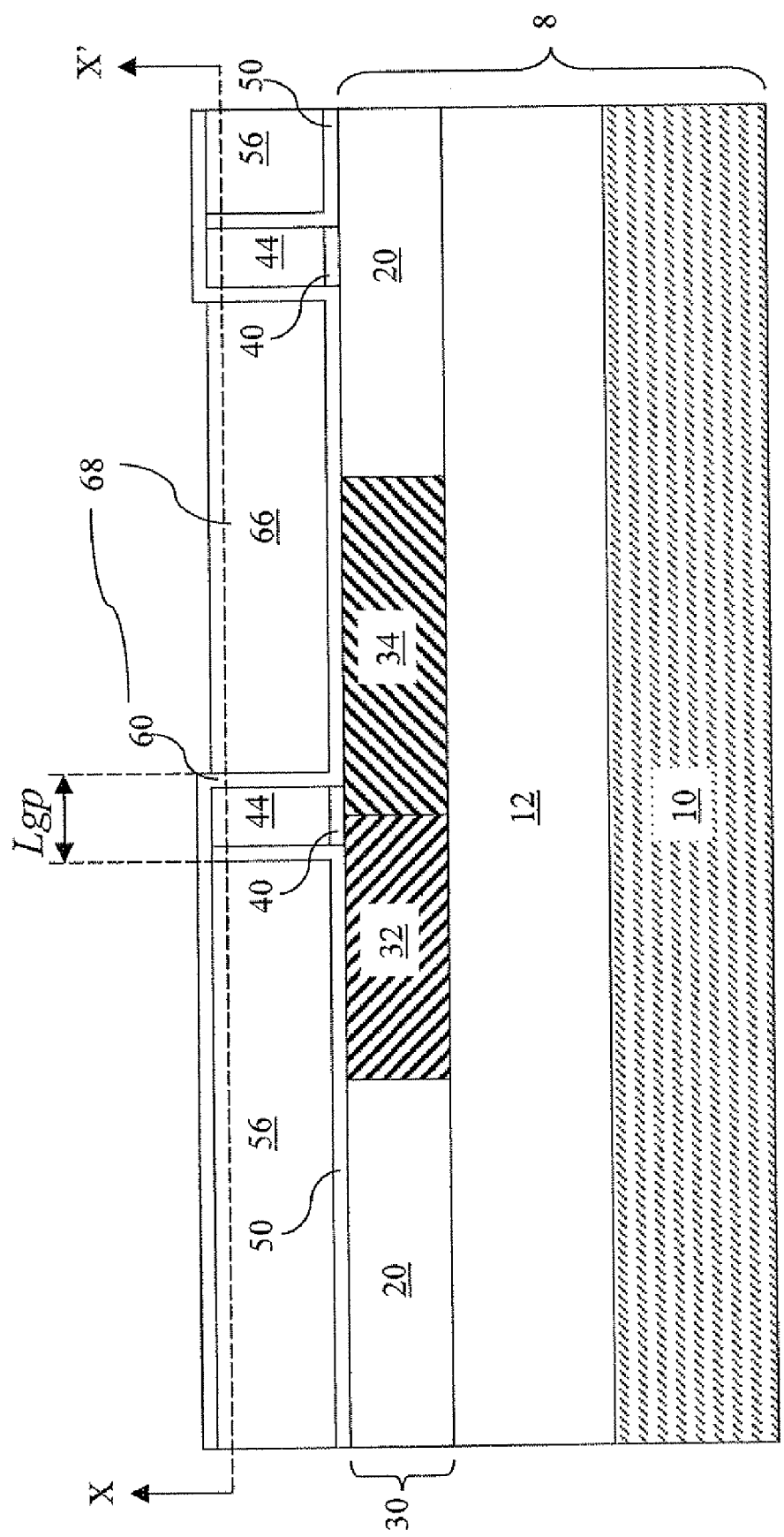
Figure 11:
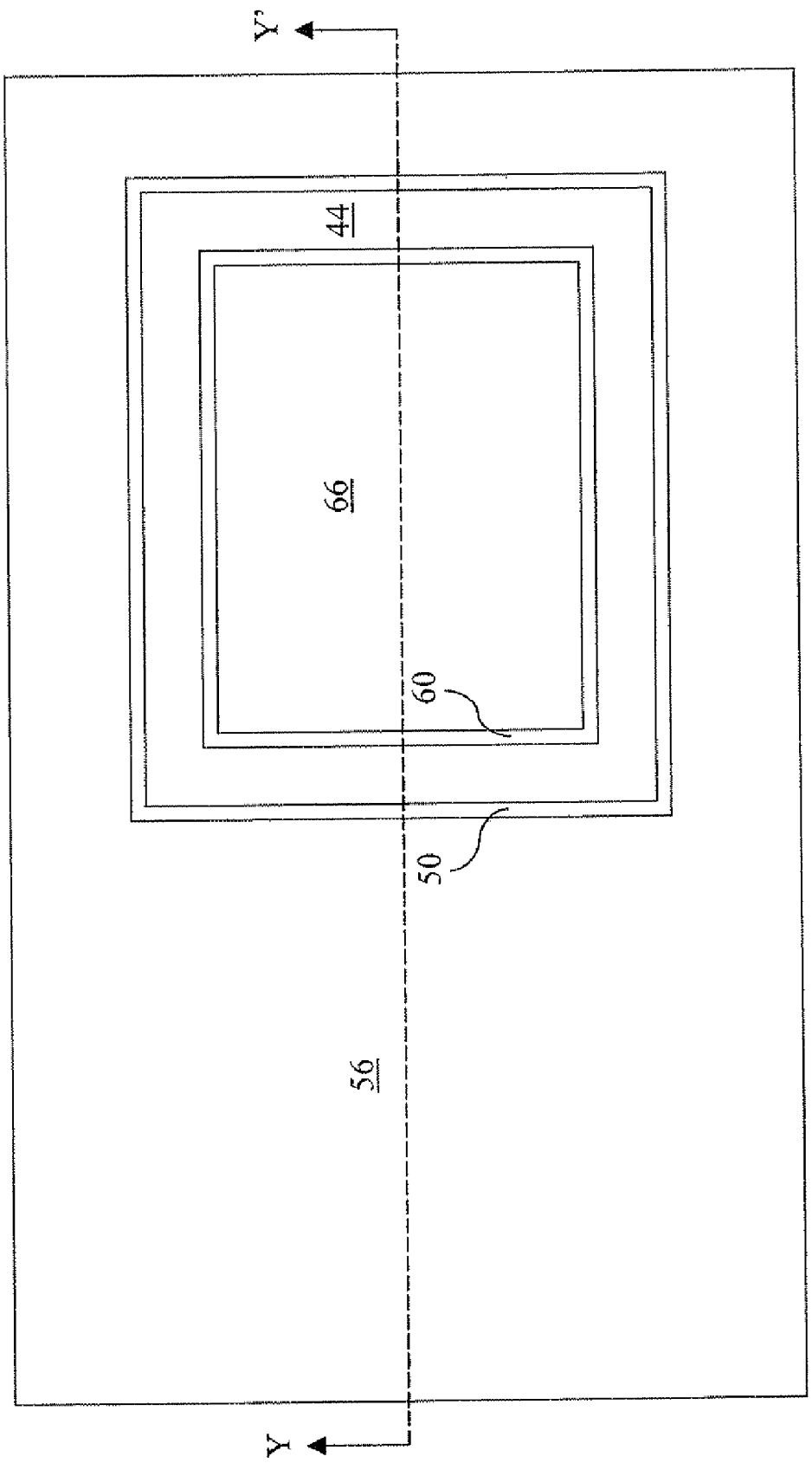

Referring to FIGS. 10 and 11, at least one replacement dielectric layer 68 is deposited and planarized. The at least one replacement dielectric layer 68 may comprise a dielectric oxide or a dielectric nitride such as silicon oxide or silicon nitride. The planarization step may employ chemical mechanical polishing employing the outer dummy spacer 44 as a stopping layer. In one embodiment, the at least one replacement dielectric layer 68 comprises a first replacement dielectric layer 60 and a second replacement dielectric layer 66 that are substantially conformally deposited on the exposed portions of the semiconductor substrate 8 in the recessed region, the outer dummy spacer 44, and the at least one planarization dielectric layer 58. The first replacement dielectric layer 60 may be a silicon nitride layer having a thickness from about 2 nm to about 20 nm, and preferably from about 3 nm to about 10 nm. The second replacement dielectric layer 66 may be a silicon oxide layer having a thickness from about 30 nm to about 400 nm, and typically from about 50 nm to about 250 nm. The first replacement dielectric layer 60 may be employed as a stopping layer during the planarization step. Alternatively, the at least one replacement dielectric layer 68 may comprise a spin-on low-k dielectric material that is self-planarizing.

In another embodiment, the at least one planarization dielectric layer 58 comprises a first planarization dielectric layer 50 and a second planarization dielectric layer 56, and the at least one replacement dielectric layer 68 comprises a first replacement dielectric layer 60 and a second replacement dielectric layer 66. The lateral distance between the second planarization dielectric layer 56 and the second replacement dielectric layer 66 is herein referred to as a preliminary gate length, Lgp, which is the same as the sum of the lateral width of the outer dummy spacer 44, a lateral width of a portion of the first planarization dielectric layer 50 on a sidewall of the outer dummy spacer, and a lateral width of a portion of the first replacement dielectric layer 60 on another sidewall of the outer dummy spacer 44.

Figure 12:
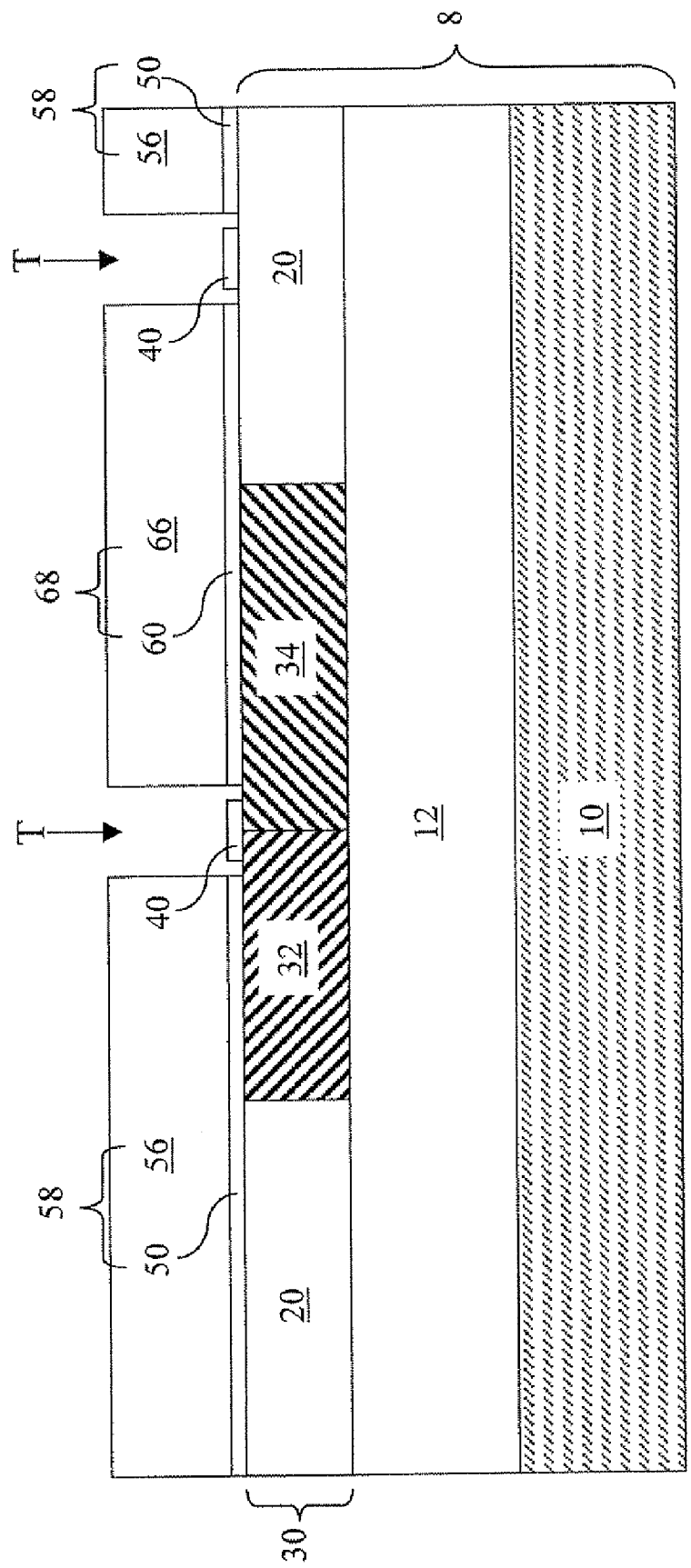

Referring to FIG. 12, the outer dummy spacer 44 is removed to form a trench T surrounded by the at least one planarization dielectric layer 58 and the at least one replacement dielectric layer 68. Vertical portions of the first planarization dielectric layer 50 and the first replacement dielectric layer 60 that laterally abuts the outer dummy spacer 44 are also removed if present.

In one embodiment, the at least one planarization dielectric layer 58 comprises a first planarization dielectric layer 50 and a second planarization dielectric layer 58, and the at least one replacement dielectric layer 68 comprises a first replacement dielectric layer 60 and a second replacement dielectric layer 66, and the first planarization dielectric layer 50 and the first replacement dielectric layer 60 comprise silicon nitride, and each of the second planarization dielectric layer 56 and the second replacement dielectric layer 66 comprises one of tetra-ethyl-ortho-silicate (TEOS) oxide, undoped silicate glass, borosilicate glass, phosphosilicate glass, fluorosilicate glass, and borophosphosilicate glass, and spin-on low-k dielectric material. In this case, a wet etch employing a hot phosphoric acid may be employed to removed the vertical portions of the first planarization dielectric layer 50 and the first replacement dielectric layer 60 selective to the second planarization dielectric layer 56 and the second replacement dielectric layer 66. Further, in case the outer dummy spacer 44 comprises silicon nitride, the same wet etch may be employed to remove the outer dummy spacer 44 and the vertical portions of the first planarization dielectric layer 50 and the first replacement dielectric layer 60 at the same time.

The trench T laterally surrounds the at least one replacement dielectric layer 68, and is surrounded by the at least one planarization dielectric layer 58. The removal of the outer dummy spacer 44 and the vertical portions of the first planarization dielectric layer 50 and the first replacement dielectric layer 60 may, or may not be selective to the sacrificial dielectric layer 40.

Figure 13:
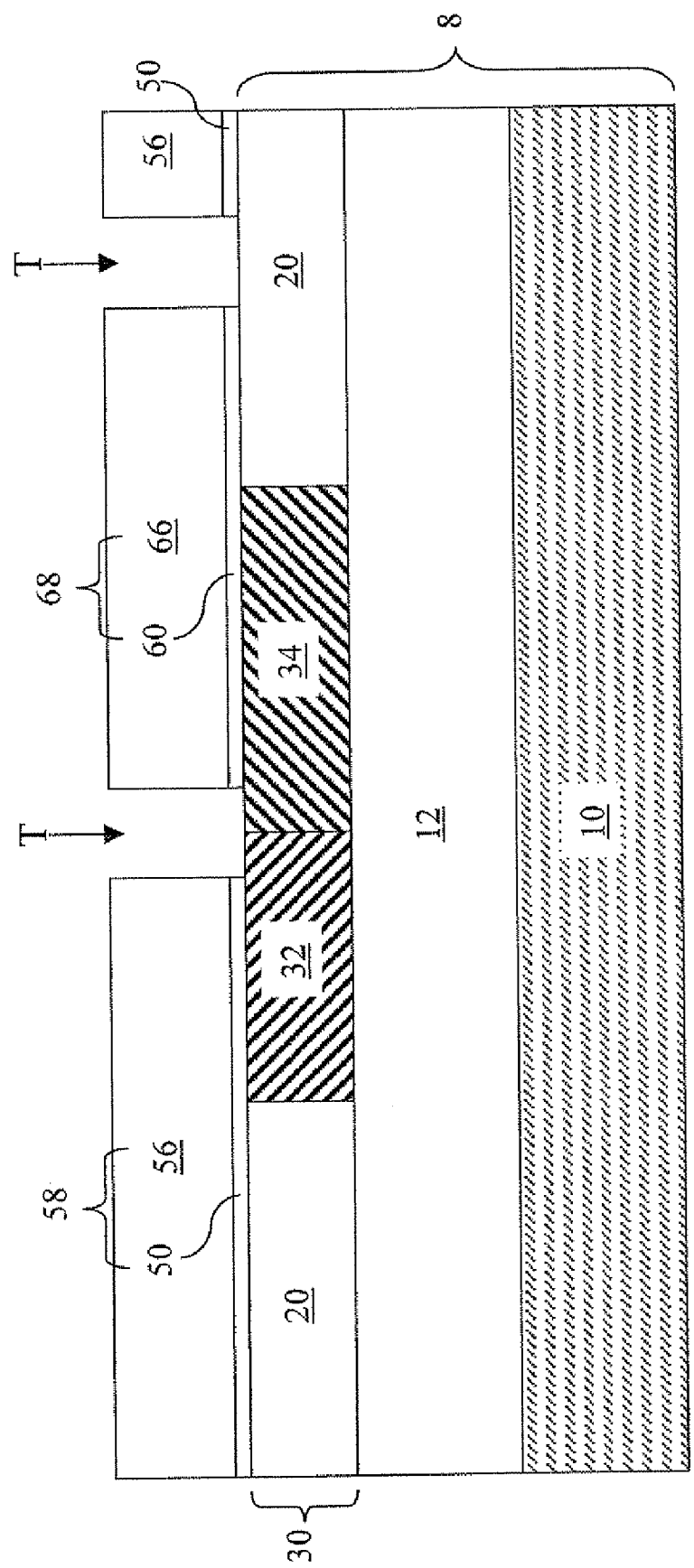

Referring to FIG. 13, any remaining portion of the sacrificial dielectric layer 40 is removed from the bottom of the trench, for example, by a wet etch or a reactive ion etch. A surface of the semiconductor region containing the interface between the first conductivity type region and the second conductivity type region is exposed. A suitable surface clean is performed on the exposed portions of the first conductivity region 32 and the second conductivity region 34. Embodiments in which a portion of the at least one planarization dielectric layer 58 and/or a portion of the at least one replacement dielectric layer 68 is laterally pulled back, for example, by a wet etch or by an isotropic dry etch, are explicitly contemplated herein.

Figure 14:
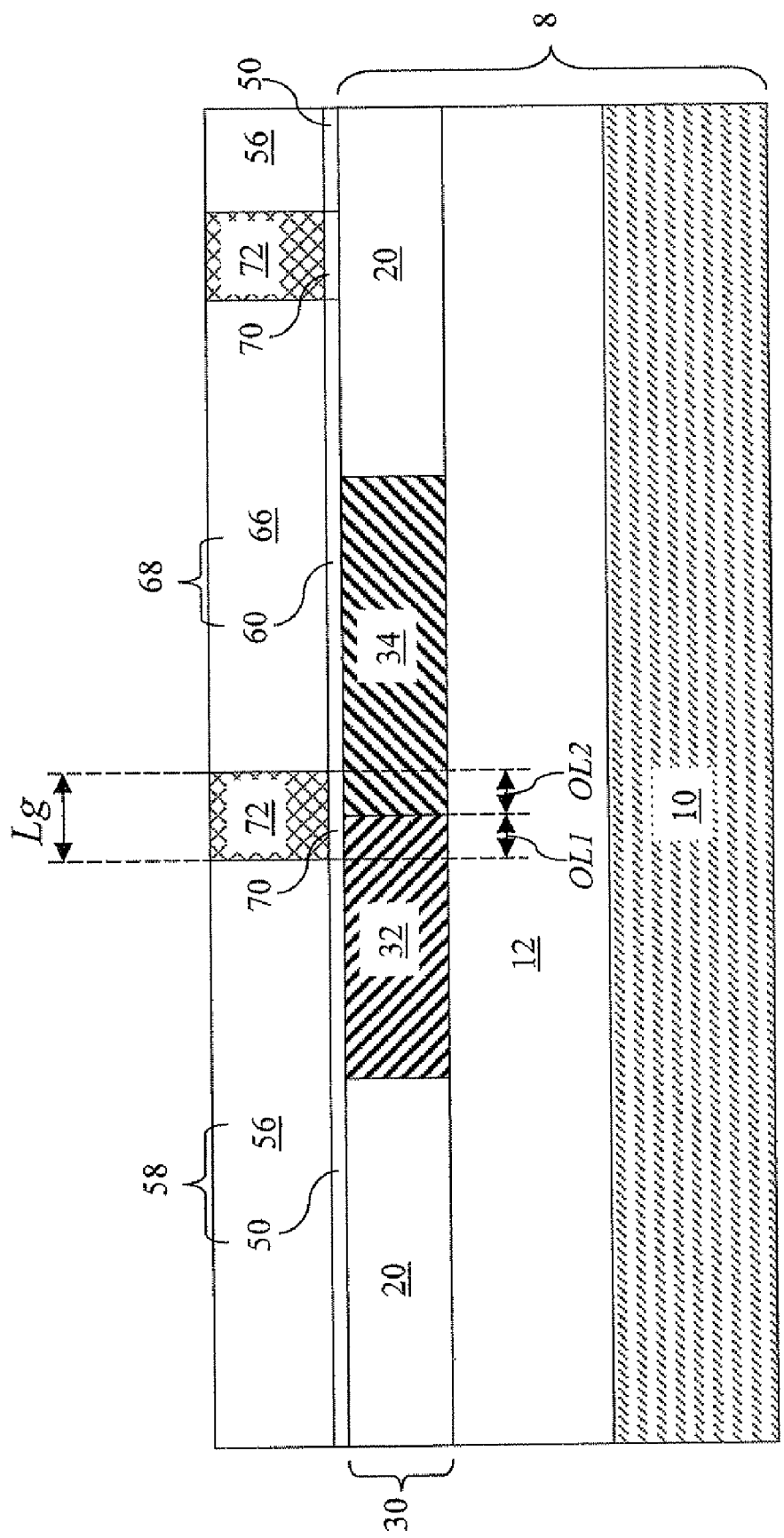

Referring to FIG. 14, a gate dielectric 70 is formed on the exposed portions of the first conductivity region 32 and the second conductivity region 34, followed by formation of a gate conductor 72 within the trench T. Residual gate conductor material above top surfaces of the at least one planarization dielectric layer 58 and the at least one replacement dielectric layer 68 is removed by planarization employing, for example, chemical mechanical polishing (CMP) and/or a recess reactive ion etch. The gate dielectric 70 may comprise a conventional gate dielectric material such as silicon oxide, silicon nitride, silicon oxynitride and/or a stack thereof. Alternately, the gate dielectric 70 may comprise a high-k dielectric material such as $HfO_2$, $ZrO_2$, $Al_2O_3$, $TiO_2$, $La_2O_3$, $SrTiO_3$, $LaAlO_3$, $Y_2O_3$ mixtures thereof, and silicates thereof thickness of the gate dielectric 70 may vary, but typically, the gate dielectric 70 has a thickness from about 0.5 nm to about 10 nm, with a thickness from about 1 nm to about 3 nm being more typical.

The gate conductor 72 may comprise a silicon containing material or a metal gate material. The silicon containing material may be an amorphous silicon, an amorphous silicon containing alloy, a polysilicon and/or a polycrystalline silicon containing alloy. Exemplary silicon containing alloys are silicon germanium alloy, silicon carbon alloy, and silicon germanium carbon alloy. The silicon containing material may be doped with dopants such as B, Ga, In, P, As, and/or Sb, or may be substantially undoped. The silicon containing material may be deposited, for example, by low pressure chemical vapor deposition (LPCVD) or rapid thermal chemical vapor deposition (RTCVD). The metal gate material is typically a gate conductor material compatible with a high-k dielectric material, and may be one of Ti, TaN, TaSiN, CoSi2, Ni, WN, W, Re, and NiSi.

A gate length Lg herein refers to the dimension between the sidewalls of the gate electrode (70, 72) around and above the interface between the first conductivity type region 32 and the second conductivity type region 34. The gate length Lg is substantially equal to the preliminary gate length Lgp, and differs from the preliminary gate length Lgp by the amount of lateral etch of the second planarization layer 56 and the second replacement layer 66, which is minimal. The gate length Lg may be, and preferably is, sublithographic, i.e., less than a minimal dimensions that is printable with lithographic techniques. For example, the gate length Lg may be from about 6 nm to about 120 nm, and preferably from about 10 nm to about 40 nm.

The gate electrode (70, 72) overlies a portion of the first conductivity type region 32 and a portion of the second conductivity type region 34. The length of the overlap between the gate electrode (70, 72) and the first conductivity type region 32, i.e., the dimension between a sidewall of the gate electrode (70, 72) above the first conductivity type region 32 and the interface between the first conductivity type region 32 and the second conductivity type region 34, is herein referred to as a first overlap length OL1. Likewise, the length of the overlap between the gate electrode (70, 72) and the second conductivity type region 34, i.e., the dimension between a sidewall of the gate electrode (70, 72) above the second conductivity type region 34 and the interface between the first conductivity type region 32 and the second conductivity type region 34, is herein referred to as a second overlap length OL2. The sum of the first overlap length OL1 and the second overlap length OL2 is the same as the gate length Lg. In one embodiment, doses and tilt angles of the first ion implantation and the second ion implantation are adjusted so that the diffusion lengths of the dopant ions in the first conductivity type region 32 and the second conductivity type region 34 are equal. In this case, the first overlap length OL1 and the second overlap length OL2 are the same and are equal to one half of the gate length Lg.

Figure 15:
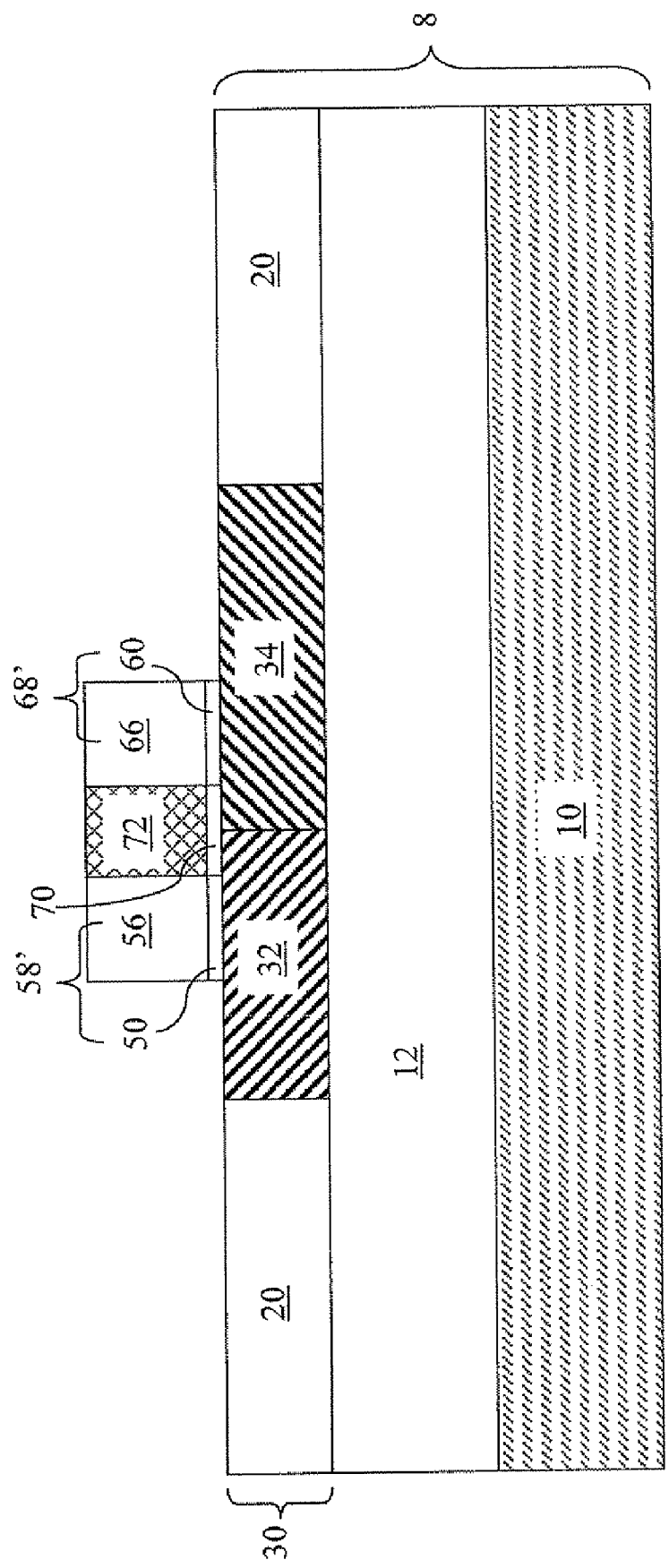

Referring to FIG. 15, a portion of the at least one planarization dielectric layer 58 and a portion of the at least one replacement dielectric layer 68 are removed by lithographic patterning and etch from above the first conductivity type region 32 and from above the second conductivity type region, respectively. A portion of the first conductivity region 32 and a portion of the second conductivity region 34 are exposed. The remaining portion of the at least one planarization dielectric layer 58 constitutes a first dielectric spacer 58', and the remaining portion of the at least one replacement dielectric spacer 68 constitutes a second dielectric spacer 68'.

The first dielectric spacer 58' and the second dielectric spacer 68' may comprise the same material or different materials. Further, the first dielectric spacer 58' and the second dielectric spacer 68' may, or may not, have the same lateral width.

In one embodiment, the first dielectric spacer 58' may comprise a vertical stack of a first planarization dielectric layer 50 and a second planarization dielectric layer 56, and the second dielectric spacer 68' may comprise a vertical stack of a first replacement dielectric layer 60 and a second replacement dielectric layer 66. The first planarization dielectric layer 50 and the first replacement dielectric layer 60 may, or may not, comprise the same material. Likewise, the second planarization dielectric layer 56 and the second replacement dielectric layer 66 may, or may not, comprise the same material.

Figure 16:
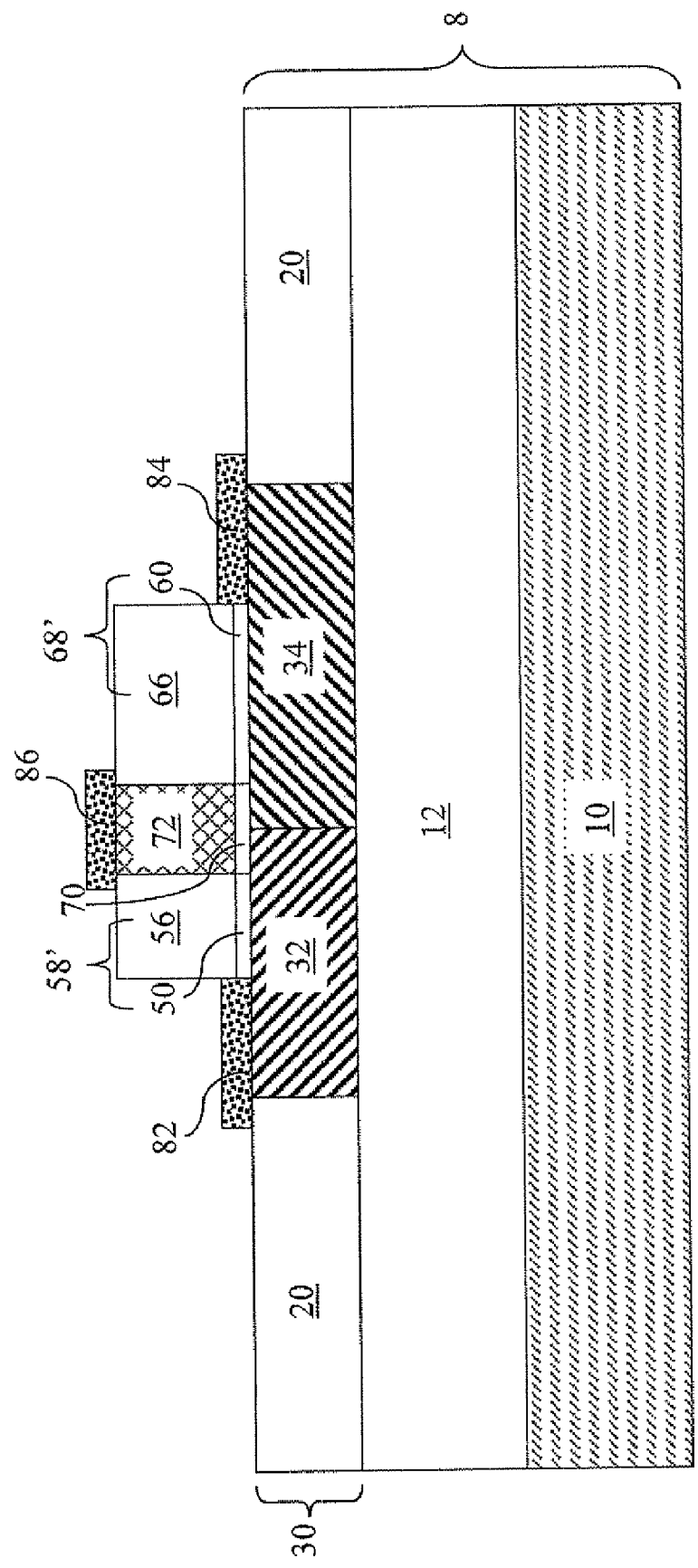

Referring to FIG. 16, various metal semiconductor alloys are formed by metallization of exposed semiconductor surfaces. Specifically, a first metal semiconductor alloy 82 is formed on the first conductivity type region 32, and a second metal semiconductor alloy 84 is formed on the second conductivity type region 34. In case the gate conductor 72 comprises a semiconductor material that may form a metal semiconductor alloy, a gate metal semiconductor alloy 86 may be formed on the gate conductor 72. In case the gate conductor 72 comprises an elemental metal, formation of a gate metal semiconductor alloy may be omitted. In case the first conductivity type region 32 and the second conductivity type region 34 comprise silicon, the first and second metal semiconductor alloys (82, 84) comprise metal silicides.

Figure 17:
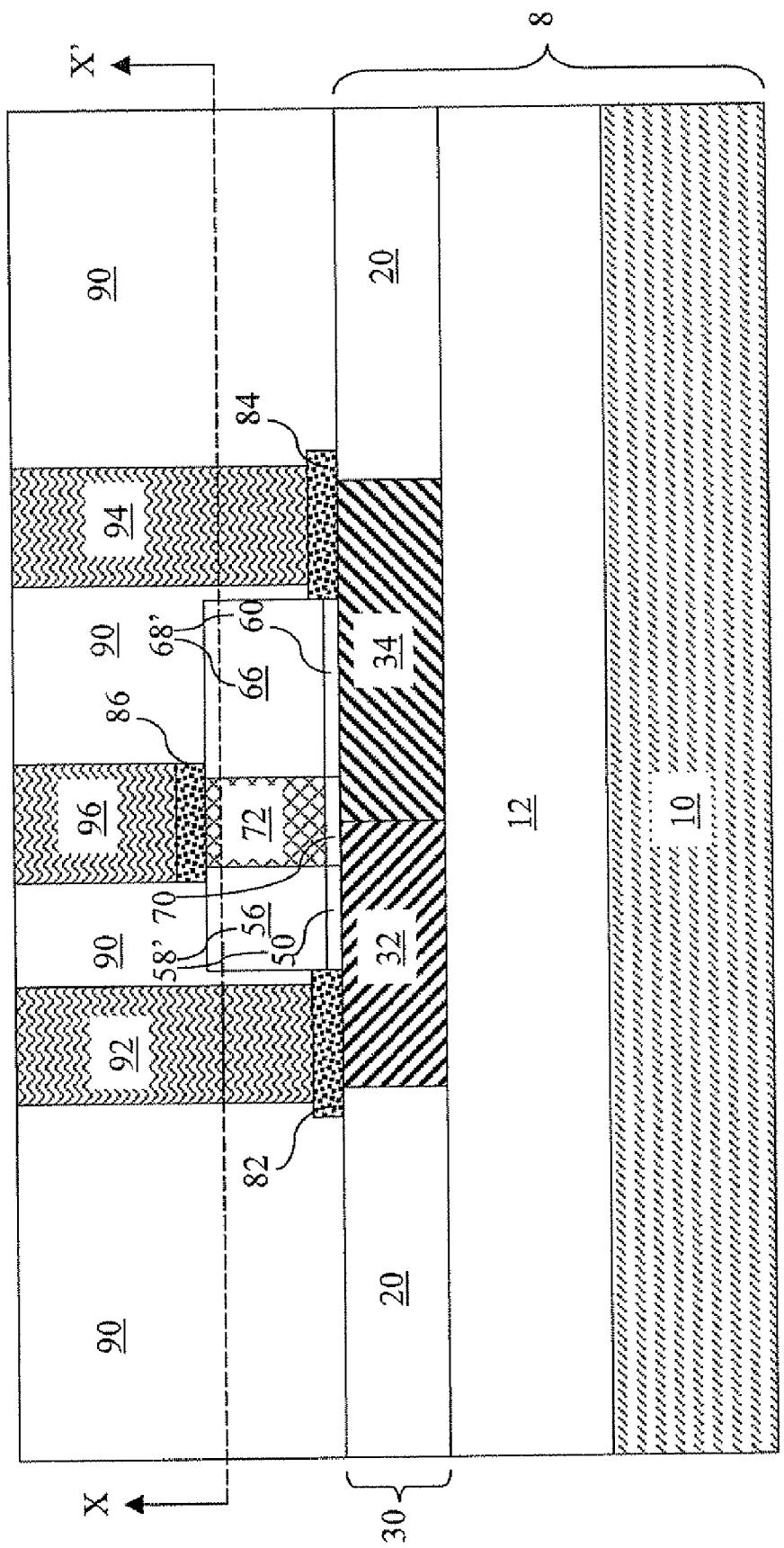
Figure 18:
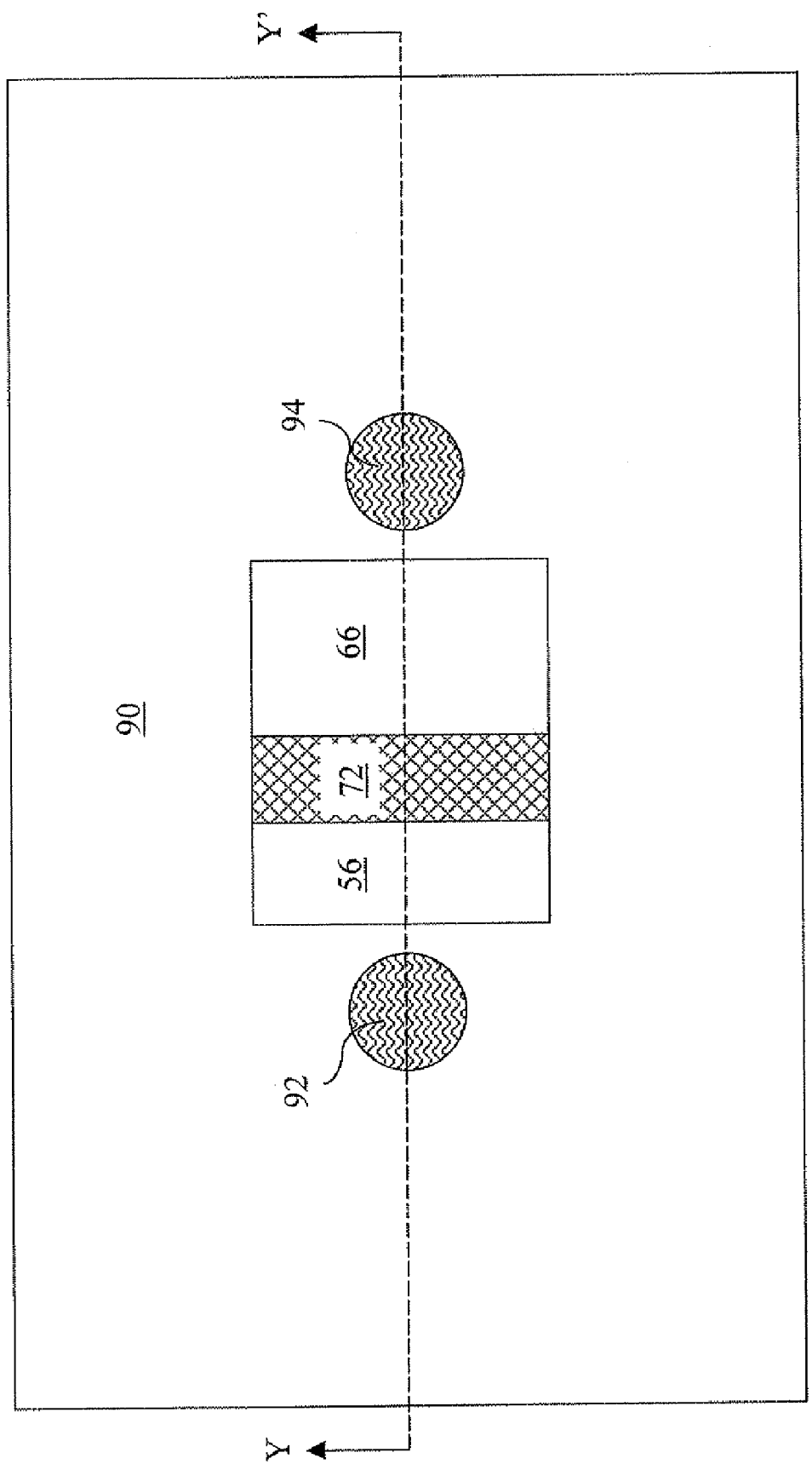

Referring to FIGS. 17 and 18, a middle-of-line (MOL) dielectric layer 90 is formed on the various metal semiconductor alloys (82, 84, 86), the shallow trench isolation 20, the first dielectric spacer 58', and the second dielectric spacer 68'. The first dielectric spacer 58' and the second dielectric spacer 68' are disjoined from each other by the gate electrode (70, 72). The MOL dielectric layer 90 may comprise a silicon oxide, a silicon nitride, a chemical vapor deposition (CVD) low-k dielectric material, a spin-on low-k dielectric material, or a stack thereof. The MOL dielectric layer 90 may contain a mobile ion diffusion barrier layer that prevents diffusion of mobile ions such as sodium and potassium from back-end-of-line (BEOL) dielectric layers. Further, the MOL dielectric layer 90 may contain a stress liner that applies tensile or compressive stress on underlying structures to alter charge carrier mobility in portions of the semiconductor substrate 8.

Non-limiting examples of the silicon oxide include undoped silicate glass (USG), borosilicate glass (BSG), phosphosilicate glass (PSG), borophosphosilicate glass (BPSG), fluorosilicate glass (FSG), and TEOS (tetra-ethyl-ortho-silicate) oxide. The silicon nitride may be a stoichiometric nitride, or a non stoichiometric nitride applying a tensile or compressive stress to underlying structures.

Contact via holes are formed in the MOL dielectric layer 90 and filled with metal to form various metal contacts. Specifically, a first metal contact via 92 is formed directly on the first metal semiconductor alloy 82, and a second metal contact via 94 is formed directly on the second metal semiconductor alloy 84. A gate contact via 96 is formed directly on the gate metal semiconductor alloy 86.

The interface between the first conductivity region 32 and the second conductivity region 34 constitutes a p-n junction, which is controlled by the gate electrode (70, 72). Interband tunneling of charge carriers is controlled by gate electrode (70, 72) in the first exemplary semiconductor structure, which is a first inventive tunneling effect transistor according to the present invention. The gate electrode (70, 72) is self-aligned to the p-n junction. Further, the gate electrode (70, 72) may have a sublithographic length, enabling a compact size, a high drive current per unit area, and a small parasitic capacitance.

Figure 19:
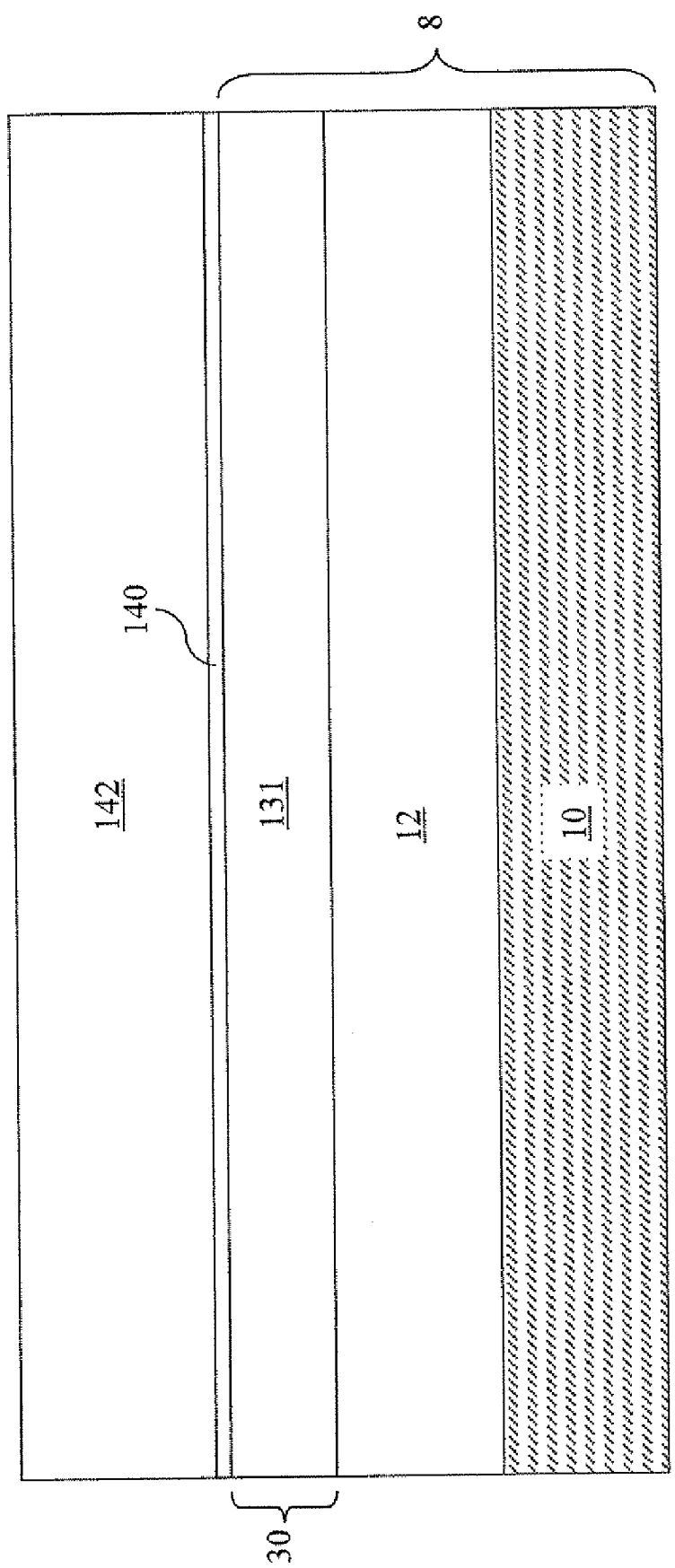
FIGS. 19-28 and 30-32 show sequential vertical cross-sectional views of a second exemplary semiconductor structure according to another embodiment of the present invention.

Referring to FIG. 19, a second exemplary semiconductor structure according to another embodiment of the present invention comprises a semiconductor substrate 8, a pad layer 140, and a mandrel layer 144. The semiconductor substrate contains a semiconductor region 131, which may be a top semiconductor layer 30 of a semiconductor-on-insulator substrate containing a handle substrate 10 and a buried insulator layer 12. The semiconductor region 131 of the second exemplary semiconductor structure may comprise the same material as the semiconductor region 31 of the first exemplary semiconductor structure described above.

The pad layer 140 comprises a dielectric material such as a dielectric oxide or a dielectric nitride. In one embodiment, the pad layer 140 comprises silicon oxide. The thickness of the pad layer 140 may be from about 1 nm to about 30 nm, and typically from about 3 nm to about 12 nm. The mandrel layer 142 may comprise a semiconductor material, a dielectric material, or a metal. In one embodiment, the mandrel layer 142 comprises silicon nitride. In another embodiment, the mandrel layer 142 comprises an amorphous or polycrystalline silicon containing alloy such as polysilicon or silicon germanium alloy. In yet another embodiment, the mandrel layer 142 comprises a spin-on low-k dielectric material that may be etched selective to conventional dielectric materials such as silicon oxide or silicon nitride. The thickness of the mandrel layer 142 may be from about 30 nm to about 200 nm, and preferably from about 50 nm to about 120 nm, although lesser and greater thicknesses are also contemplated herein.

Figure 20:
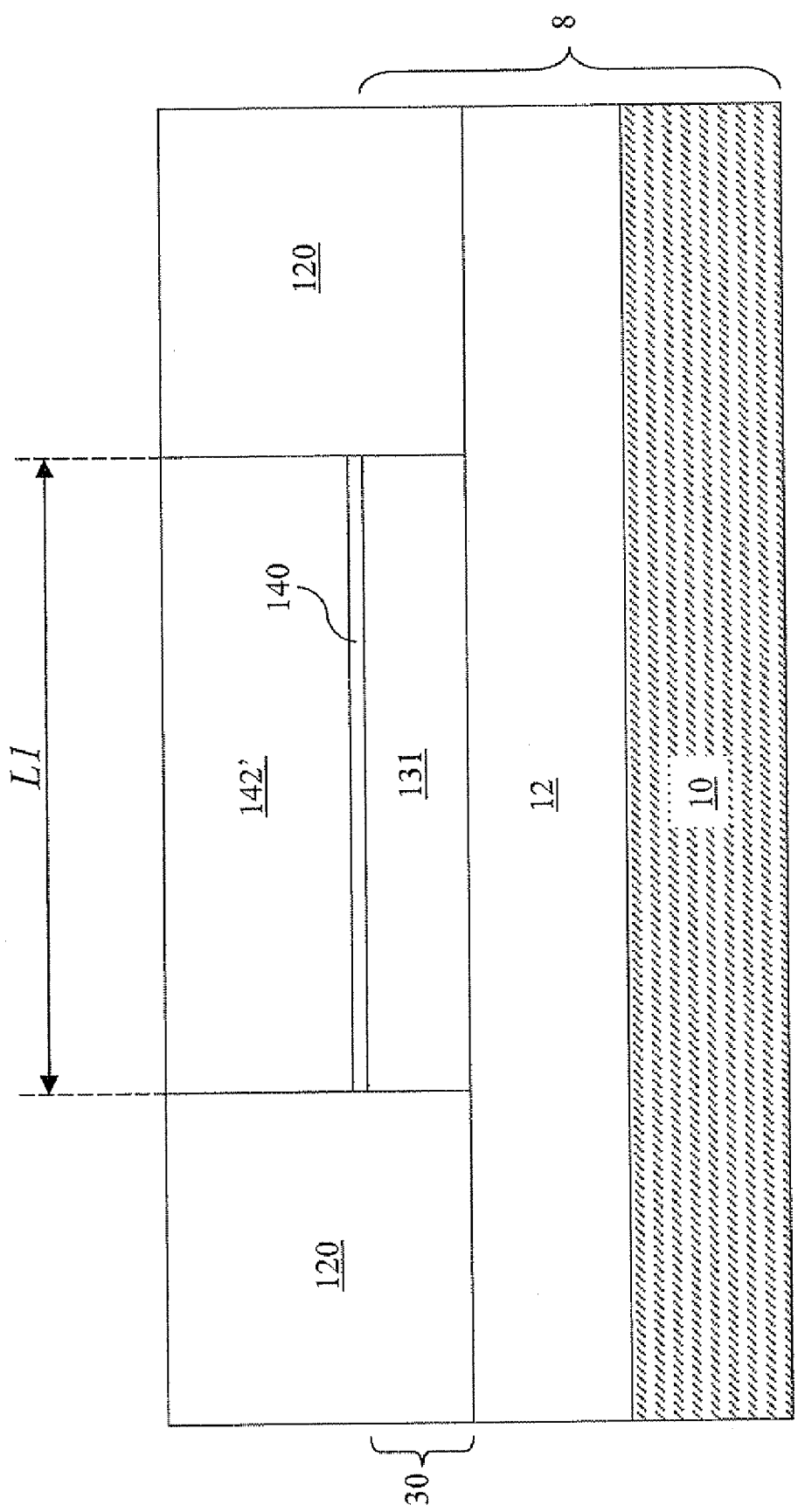

Referring to FIG. 20, a photoresist (not shown) is applied to a top surface of the mandrel layer 142 and lithographically patterned. The pattern in the photoresist is transferred into the stack of the mandrel layer 142, the pad layer 140, and the semiconductor region 131 by a reactive ion etch to form a shallow trench (not shown). Preferably, the shallow trench exposes a top surface of the buried insulator layer 12. The remaining portion of the mandrel layer 142 constitutes a mandrel 142'. The stack of the mandrel 142', the pad layer 140, and the semiconductor region 131 is surrounded by the shallow trench.

A dielectric material is deposited in the shallow trench and planarized to form shallow trench isolation 120. Known methods of planarization such as chemical mechanical polishing (CMP) may be employed for planarization of the deposited dielectric material. A top surface of the mandrel 142' is substantially flush with a top surface of the shallow trench isolation 120. In one embodiment, the mandrel 142' comprises silicon nitride and the shallow trench isolation 120 comprise so that the mandrel 142' may be employed as a stopping layer of a CMP step. Other materials that may be employed in the shallow trench isolation 120 are well known in the art.

A length L1 of the mandrel 142' may be at or near a lithographic minimum dimension, or a lithographic "critical dimension." In general, a small dimension for the length L1 is preferable to fabricate a tunneling effect transistor having a high drive current per unit area and a small parasitic capacitance. The length L1 may be from about 50 nm to about 200 nm, although lesser and greater dimensions for the length L1 within allowable lithographic limitations are also contemplated herein.

Figure 21:
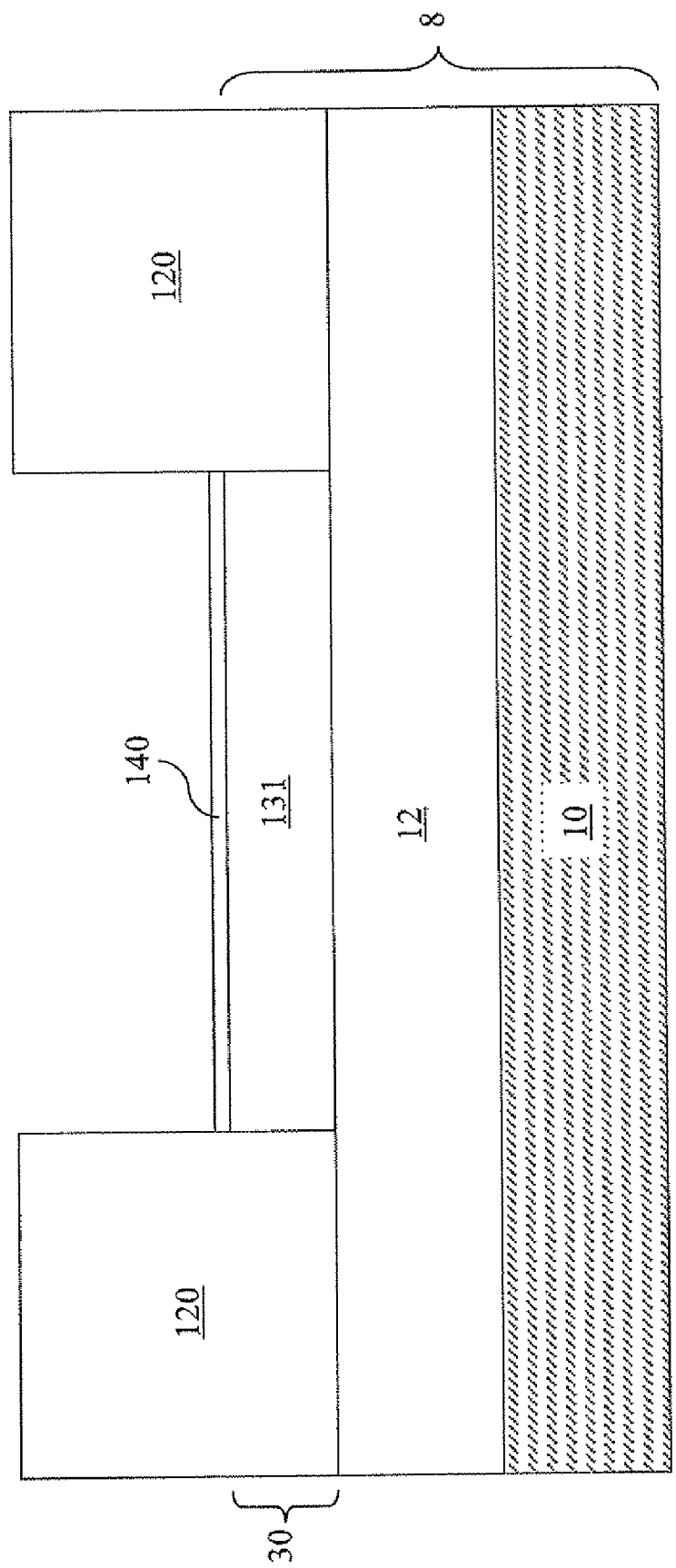

Referring to FIG. 21, the mandrel 142' is removed selective the shallow trench isolation 120. Preferably, the removal of the mandrel 142' is also selective to the pad layer 140. In one embodiment, the mandrel 142' comprises silicon nitride and the shallow trench isolation 120 and the pad layer 140 comprise silicon oxide. A wet etch chemistry employing a hot phosphoric acid may be used to remove the mandrel 142' selective to the shallow trench isolation 120 and the pad layer 140. A recessed region is formed in the space from which the mandrel 142' is removed.

Figure 22:
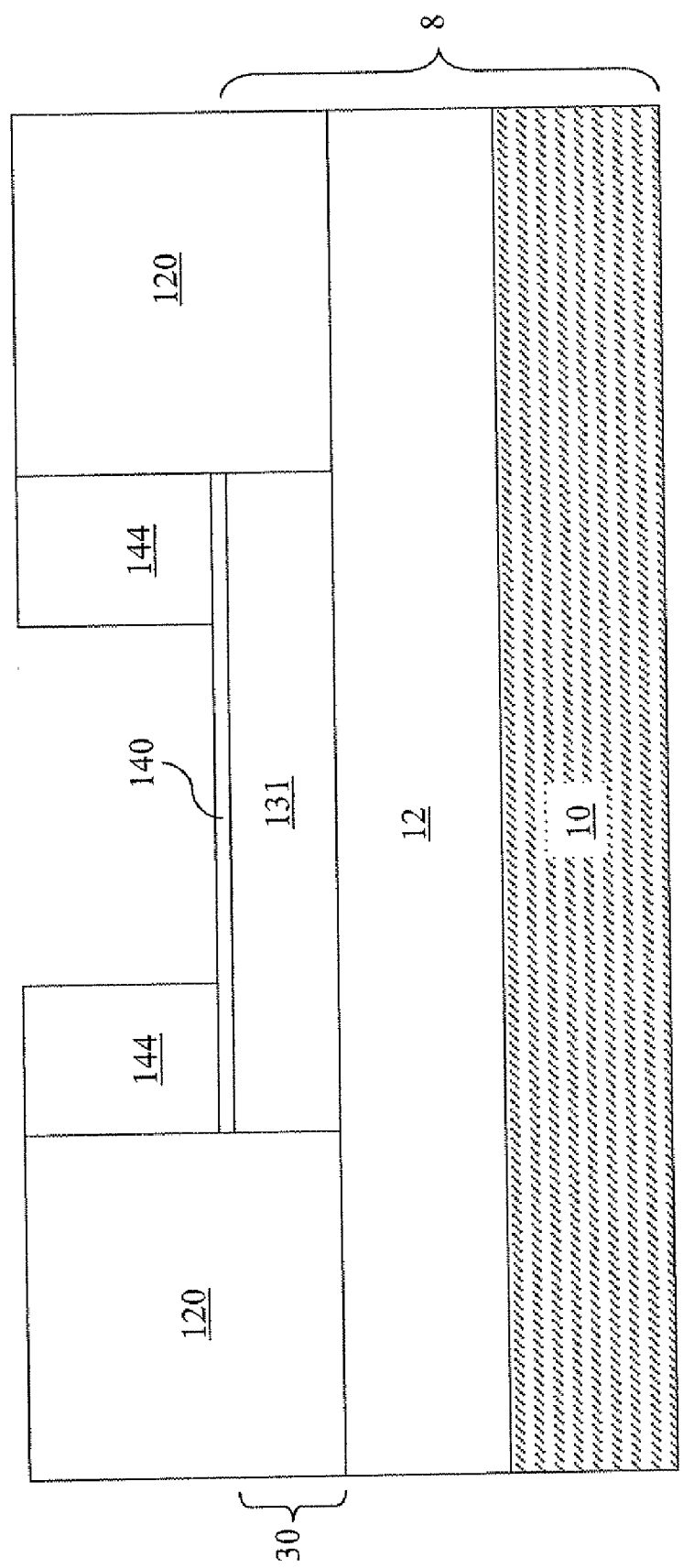

Referring to FIG. 22, an inner dummy spacer layer (not shown) is substantially conformally deposited and anisotropically etched to form an inner dummy spacer 144 laterally abutting the sidewalls of the shallow trench isolation 120 along the periphery of the recessed region. The anisotropic ion etch may, or may not, be selective to the pad layer 140. Preferably, the anisotropic etch is selective to the pad layer 140. In one embodiment, the inner dummy spacer 144 comprises a silicon oxide such as tetra-ethyl-ortho-silicate (TEOS) oxide, undoped silicate glass, borosilicate glass, phosphosilicate glass, fluorosilicate glass, and borophosphosilicate glass, and spin-on low-k dielectric material. In another embodiment, the inner dummy spacer 144 may comprise a silicon germanium alloy having a germanium concentration from about 2% to about 40%, and preferably from about 5% to about 20% in atomic concentration. The inner dummy spacer 144 is formed on "inner" sidewalls of the shallow trench isolation 120. Thus, the inner dummy spacer 144 is inherently topologically homeomorphic to a torus, i.e., may be continually stretched and bent in a continual manner without forming a singularity such as piercing, cutting, or joining. In other words, the shape of the inner dummy spacer 144 is a three-dimensional object of genus 1, or has one topological "handle." Preferably, the lateral width of the inner dummy spacer 144 is sublithographic, i.e., less than a minimal dimension that is printable with lithographic techniques. For example, the lateral width of the inner dummy spacer 144 may be from about 2 nm to about 50 nm, and preferably from about 5 nm to about 40 nm.

Figure 23:
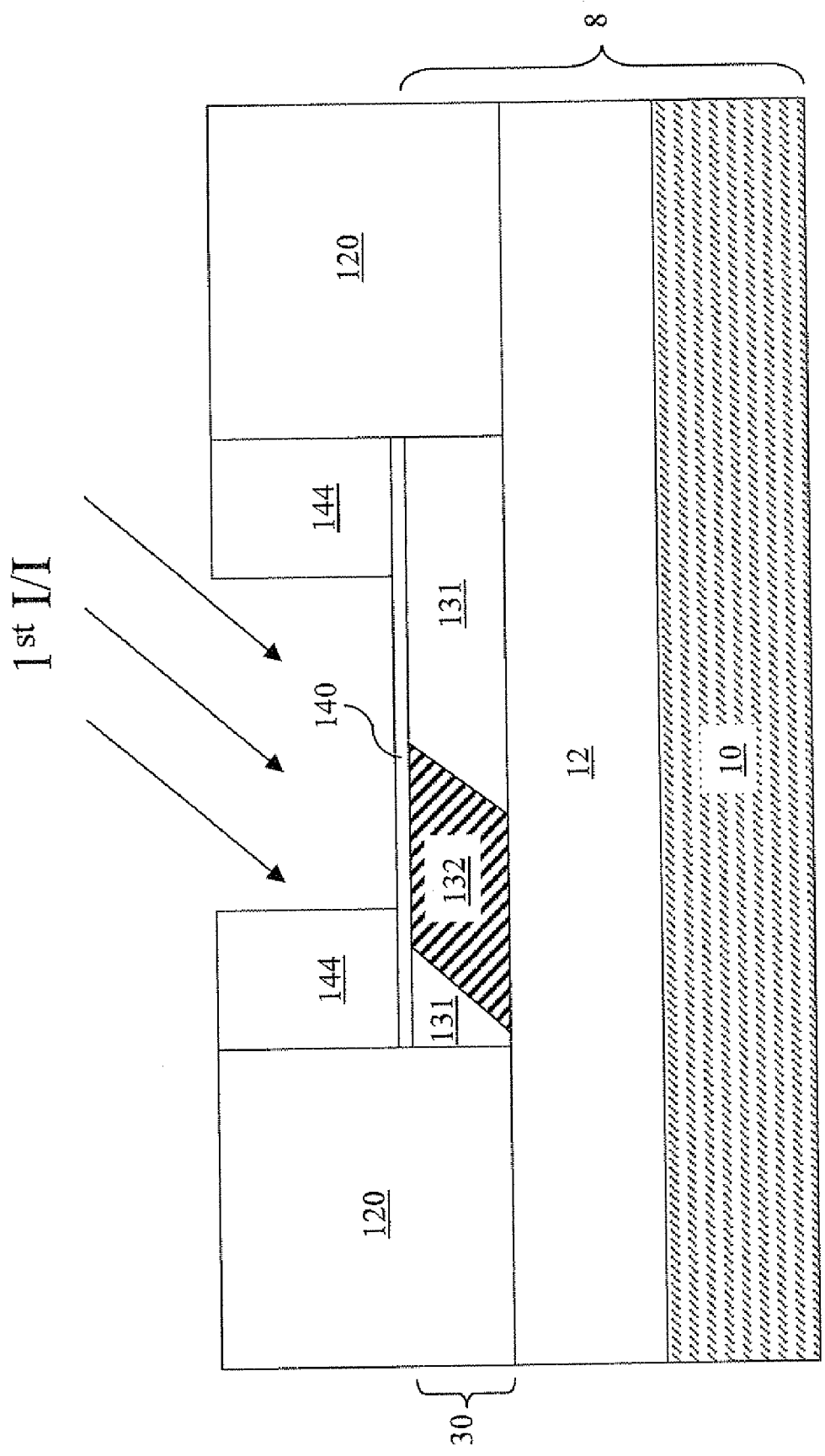

Referring to FIG. 23, a first angled ion implantation is performed into a first side of an exposed portion of the semiconductor region 131 employing the shallow trench isolation 120 and the inner dummy spacer 144 as an implantation block mask. Dopant ions of a first conductivity type are implanted into the first side of the exposed portion of the semiconductor region 131 to form a first conductivity type region 132. The direction of the first ion implantation is shown with a set of arrows labeled $1^{st}$ I/I. The tilt angle of the first ion implantation may be from about 10 degrees to about 60 degrees, and preferably, from about 30 degrees to about 45 degrees from a surface normal of the exposed surface of the semiconductor region 131. The first conductivity type may be p-type, and ions of the first conductivity type may comprise at least one of B, Ga, and In. Alternatively, the first conductivity type may be n-type, and ions of the first conductivity type may comprise at least one of P, As, and Sb. Preferably, the energy of the first ion implantation is sufficient for the first conductivity type region 132 to reach a bottom surface of the semiconductor region 131. The shape of the first conductivity type region may substantially be a parallelepiped. The size of the semiconductor region 131, which herein refers to the portion having the same composition as before the first ion implantation, is accordingly reduced with the formation of the first conductivity type region 132. Depending on the geometry of the first ion implantation, the semiconductor region 131 may comprise two disjoined portions. The first conductivity type region 132 may have a doping concentration from about $1.0 \times 10^{18}/cm^3$ to about $3.0 \times 10^{21}/cm^3$, and preferably from about $3.0 \times 10^{19}/cm^3$ to about $1.0 \times 10^{21}/cm^3$.

Figure 24:
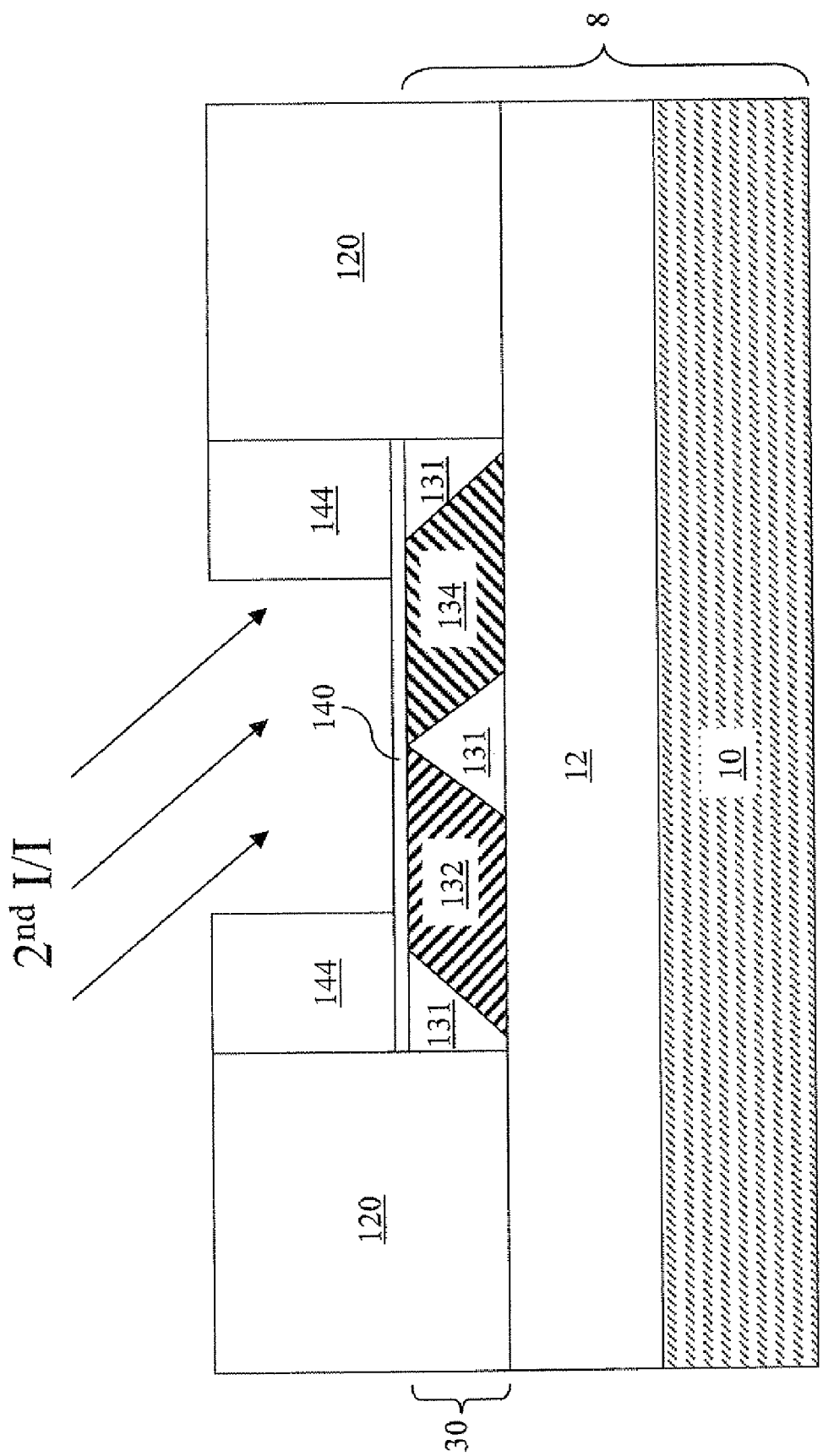

Referring to FIG. 24, a second angled ion implantation is performed into a second side, which is the opposite side of the first side, of an exposed portion of the semiconductor region 131 employing the shallow trench isolation 120 and the inner dummy spacer 144 as an implantation block mask. Dopant ions of a second conductivity type, which is the opposite conductivity type of the first conductivity type, are implanted into the second side of the exposed portion of the semiconductor region 131 to form a second conductivity type region 134. The direction of the second ion implantation is shown with a set of arrows labeled $2^{nd}$ I/I. The tilt angle of the second ion implantation may be from about 10 degrees to about 60 degrees, and preferably, from about 30 degrees to about 45 degrees from a surface normal of the exposed surface of the semiconductor region 131. Preferably, the energy of the second ion implantation is sufficient for the second conductivity type region 134 to reach a bottom surface of the semiconductor region 131. The shape of the second conductivity type region may substantially be another parallelepiped. In one embodiment, the magnitude of the tilt angles of the first and second ion implantations are the same, while the directions of the tilt are the opposite. The size of the semiconductor region 131, which herein refers to the portion having the same composition as before the second ion implantation, is accordingly reduced with the formation of the second conductivity type region 134. Depending on the geometry of the second ion implantation, the semiconductor region 131 may comprise two disjoined portions. The second conductivity type region 134 may have a doping concentration from about $1.0 \times 10^{18}$/cm$^3$ to about $3.0 \times 10^{21}$/cm$^3$, and preferably from about $3.0 \times 10^{19}$/cm$^3$ to about $1.0 \times 10^{21}$/cm$^3$.

Figure 25:
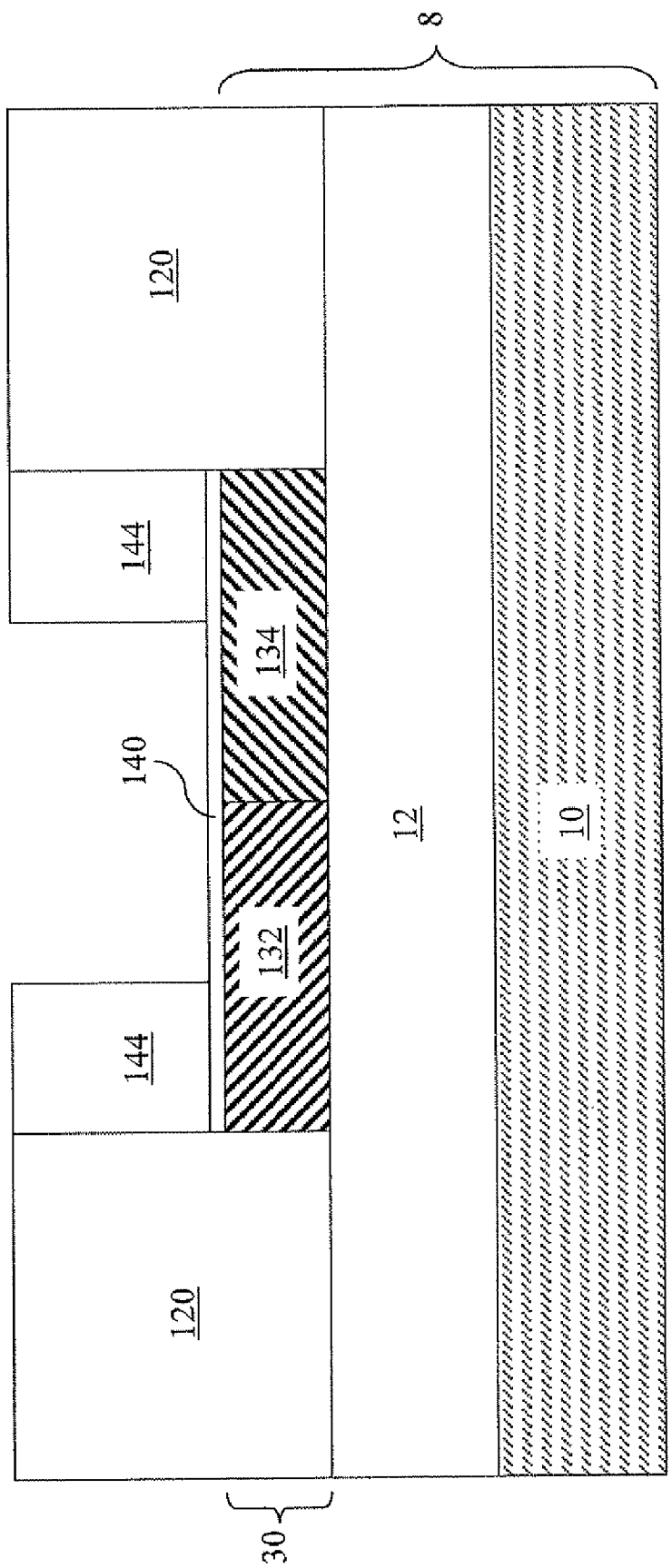

Referring to FIG. 25, an anneal is performed to diffuse the dopants in the first conductivity type region 132 and the second conductivity type region 134 as well as activating the implanted dopants and healing structural damages that may have been introduced during the first and second angled ion implantation steps. The temperature and duration of the anneal is selected such that diffusion lengths of the dopants in the first conductivity type region 32 and the second conductivity type region 34 are at least equal to one half of the lateral separation of the first and second conductivity type regions (132, 134) at the bottom of the top semiconductor layer 30. At the end of the anneal step, the first conductivity type region 132 laterally abuts the second conductivity type region 134. The doping concentrations of the first conductivity type region 132 and the second conductivity type region 134 are substantially on the same order of magnitude as prior to the anneal.

Figure 26:
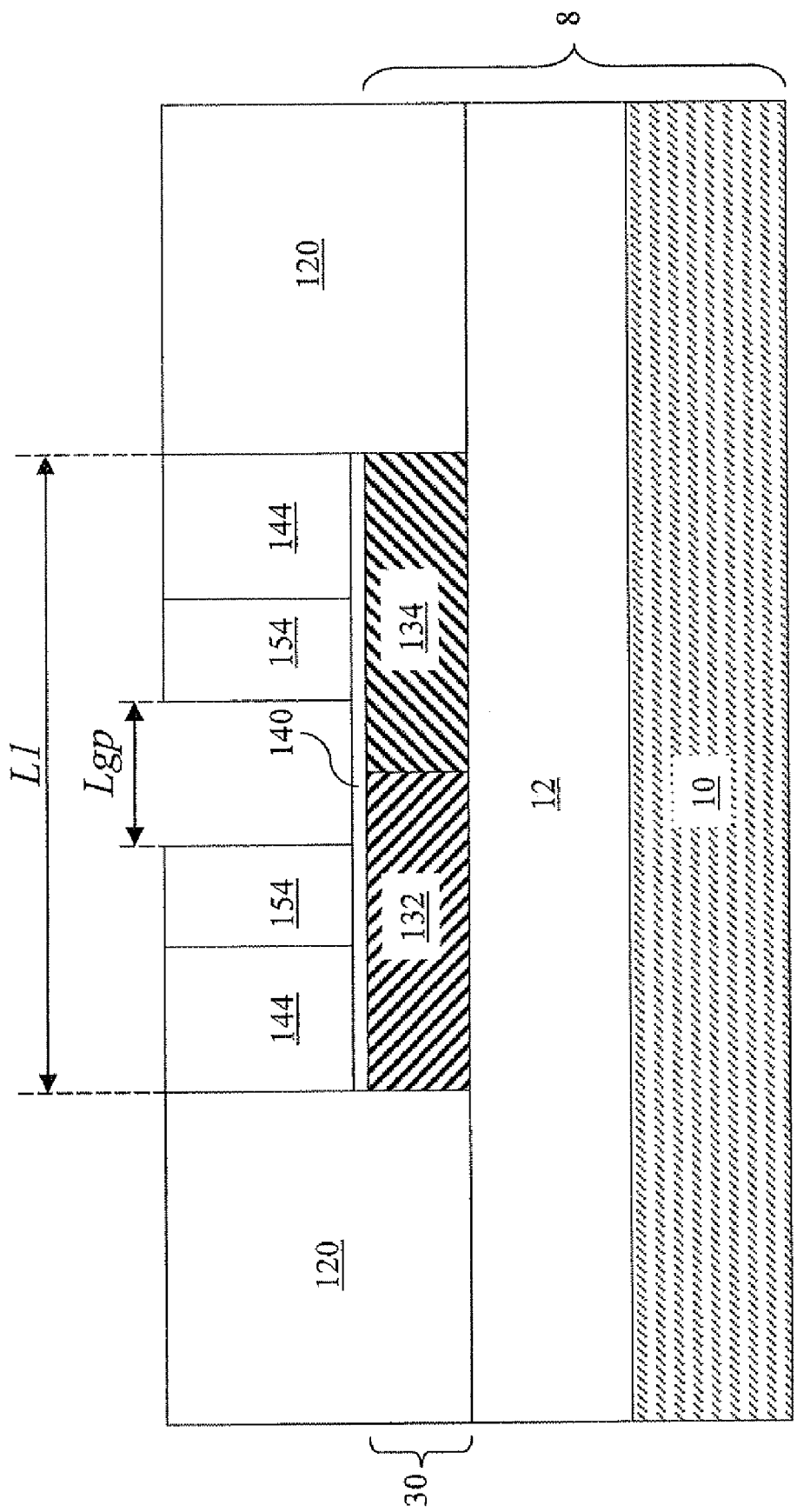

Referring to FIG. 26, a gate spacer 154 is formed on the inner sidewalls of the inner dummy spacer by deposition and a reactive ion etch of a dielectric material layer (not shown). The reactive ion etch may, or may not, be selective to the pad layer 140. The gate spacer 154 comprises a dielectric material such as a dielectric oxide or a dielectric nitride. The gate spacer 154 comprises a different material from the material of the inner dummy spacer 144 to allow selective removal of the inner dummy spacer 144 relative to the gate spacer 154 in a subsequent processing step. Preferably, the gate spacer 154 comprises a different material from the material of the shallow trench isolation 120. For example, the gate spacer 154 may comprise one of silicon nitride, silicon oxynitride. In one embodiment, the shallow trench isolation 120 and the inner dummy spacer 144 comprise silicon oxide, and the gate spacer 144 comprises silicon nitride.

The gate spacer 154 is formed on inner sidewalls of the inner dummy spacer 144. Thus, the gate spacer 144 is also inherently topologically homeomorphic to a torus, i.e., may be continually stretched and bent in a continual manner without forming a singularity such as piercing, cutting, or joining. In other words, the shape of the gate spacer 154 is a three-dimensional object of genus 1, or has one topological "handle." Preferably, the lateral width of the inner spacer 144 is sublithographic, i.e., less than a minimal dimension that is printable with lithographic techniques. For example, the lateral width of the gate spacer 154 may be from about 10 nm to about 80 nm, and preferably from about 20 nm to about 45 nm, although lesser and greater dimensions are also contemplated herein.

The distance between two opposite sidewalls of the gate spacer 154 that are substantially parallel to the interface between the first conductivity type region 132 and the second conductivity type region 134 is herein referred to as a preliminary gate length Lgp. The preliminary gate length Lgp may be, and preferably is, a sublithographic dimension. For example, the preliminary gate length Lgp may be from about 6 nm to about 120 nm, and preferably from about 10 nm to about 40 nm.

Figure 27:
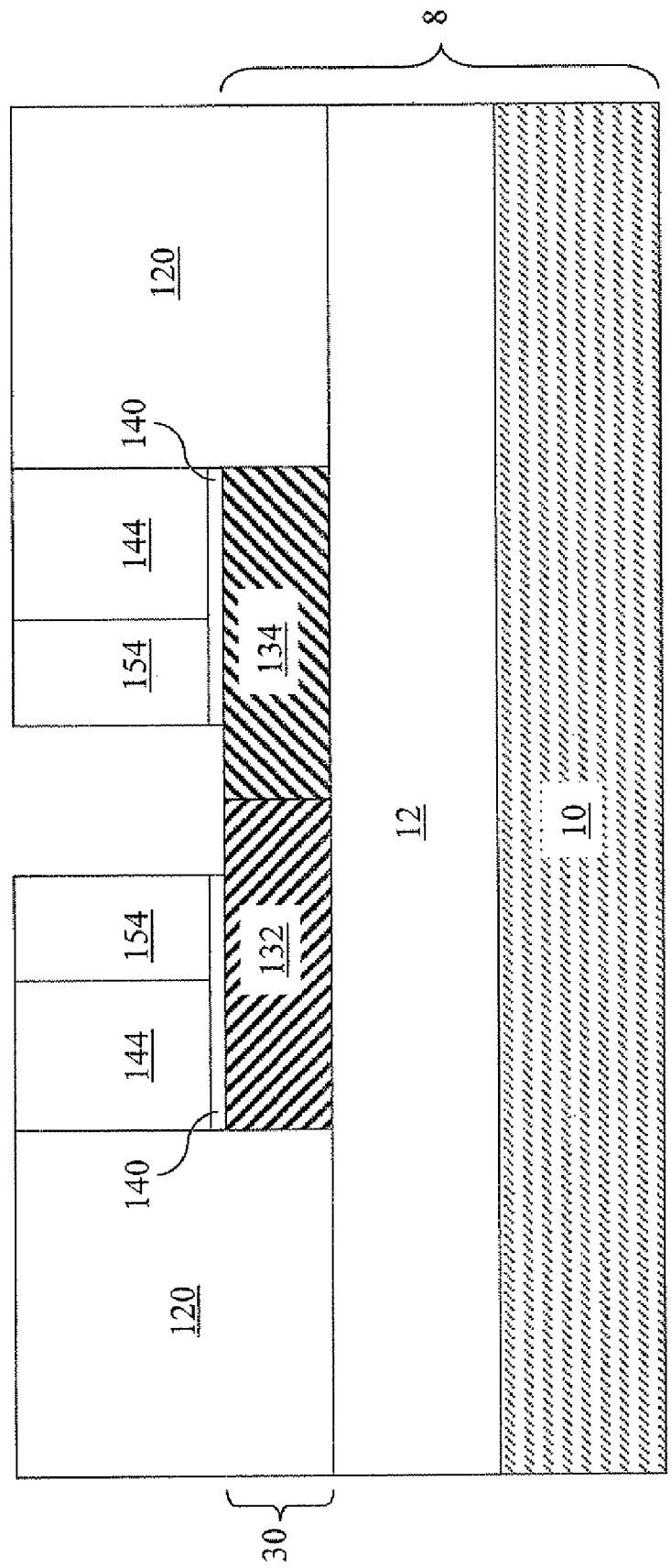

Referring to FIG. 27, any remaining portion of the pad layer 140 is removed from the remaining recessed region by a wet etch or a reactive ion etch. A suitable surface cleaning may be performed at this point.

Figure 28:
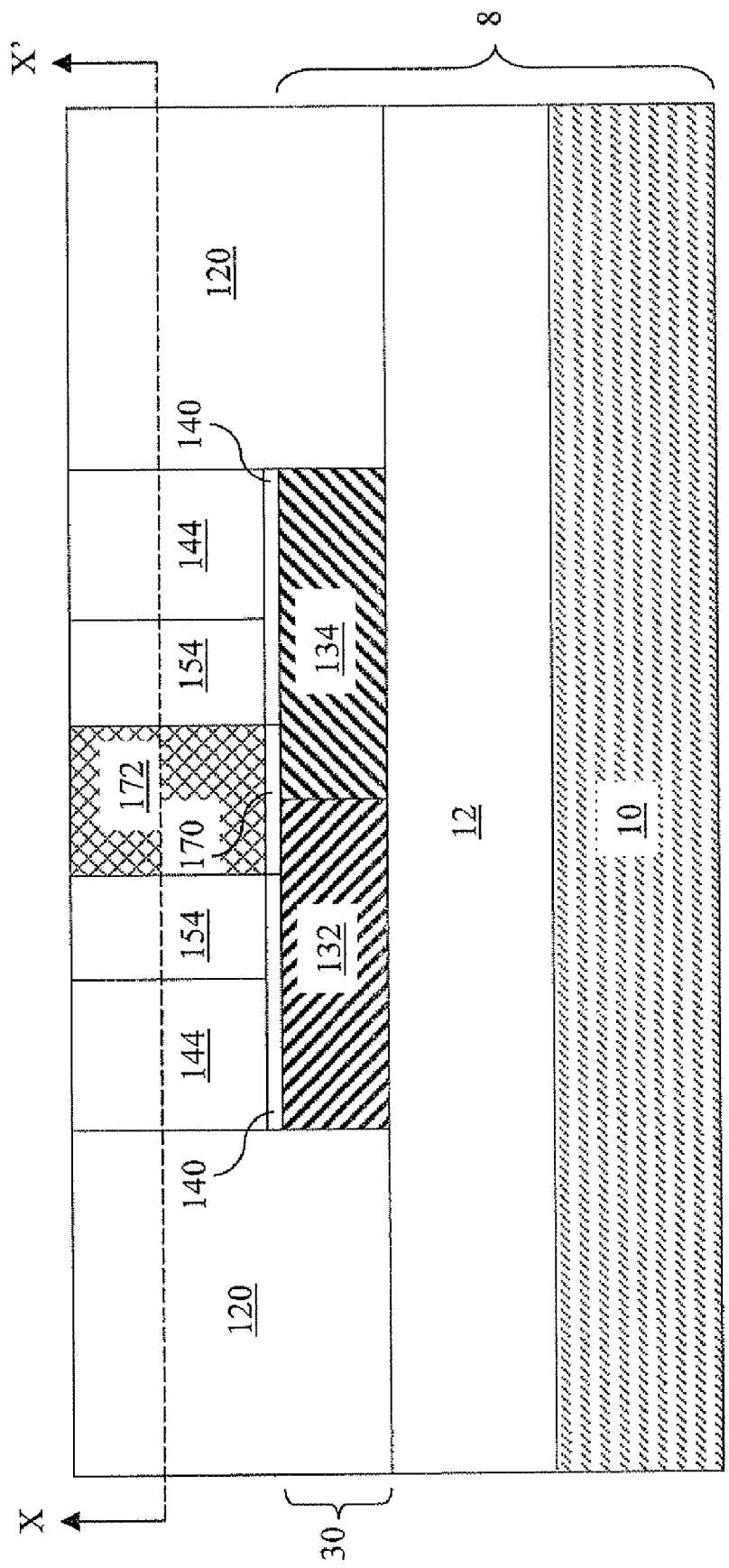
Figure 29:
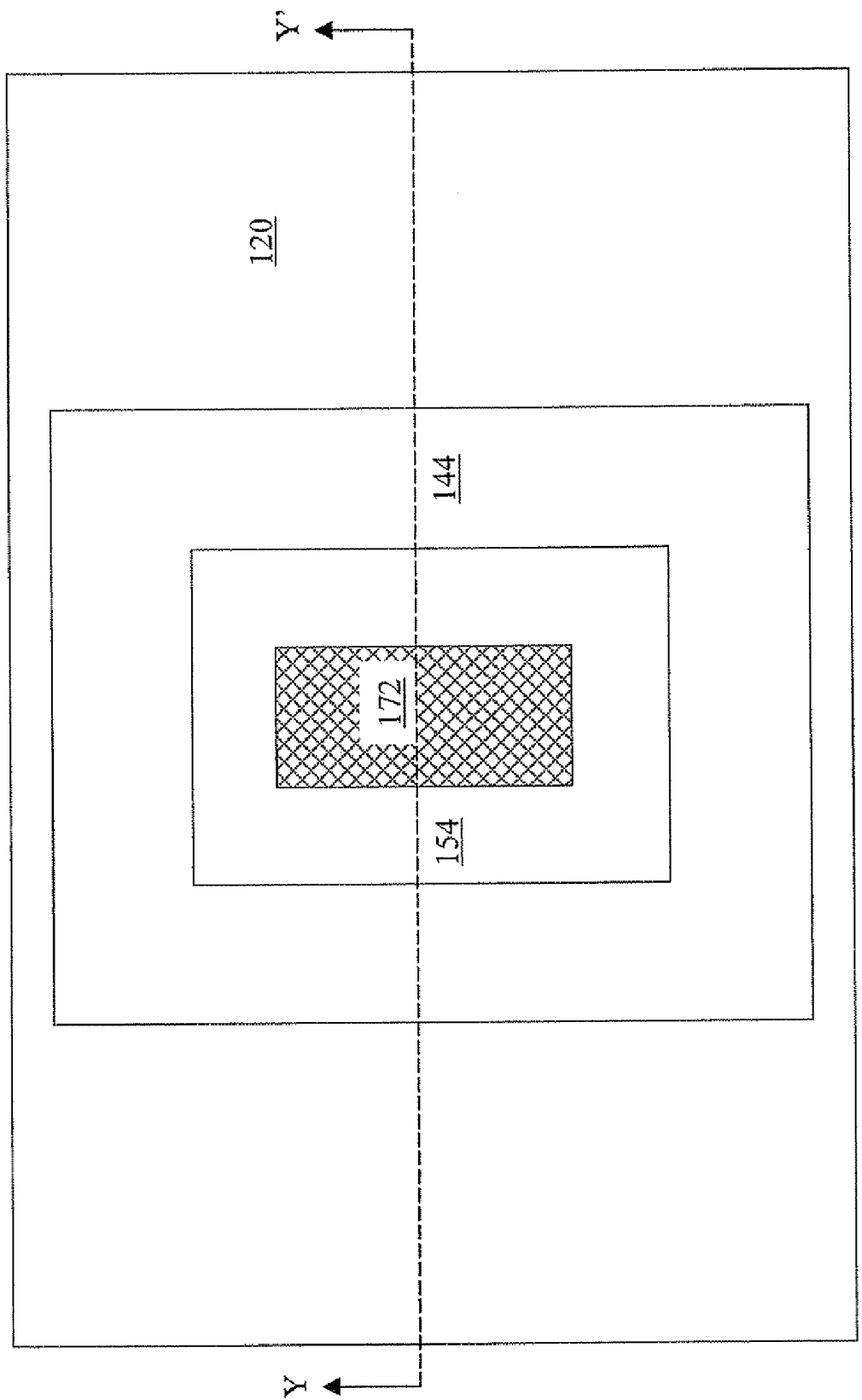
FIGS. 29 and 33 are horizontal cross-sectional views of FIGS. 28 and 32, respectively, along the plane X-X'. The vertical cross-sectional view of FIGS. 28 and 32 correspond to the vertical plane Y-Y' in FIGS. 29 and 33, respectively.
Figure 30:
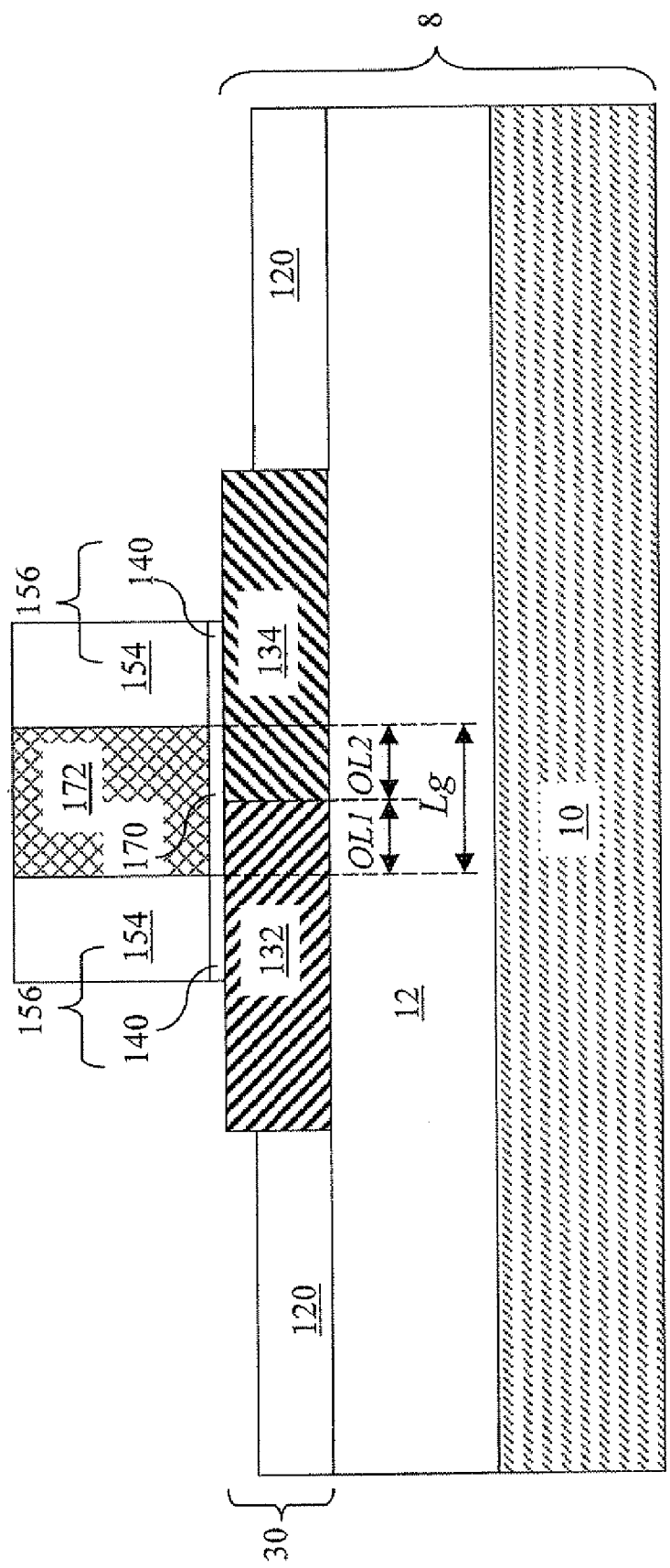

Referring to FIGS. 28 and 29, a gate dielectric 170 is formed on the exposed portions of the first conductivity region 132 and the second conductivity region 134, followed by formation of a gate conductor 172 within the remaining recessed region. Residual gate conductor material above a top surface of the gate spacer 154 is removed by planarization employing, for example, chemical mechanical polishing (CMP) an/or a recess reactive ion etch. The gate dielectric 170 in the second exemplary semiconductor structure may have the same thickness and composition as the gate dielectric 70 in the first embodiment. The gate conductor 172 in the second exemplary semiconductor structure may comprise the same material as the gate dielectric 72 in the first exemplary semiconductor structure.

Referring to FIG. 29, the shallow trench isolation 120 is recessed by a reactive ion etch or a wet etch. At the same time or sequentially, the inner dummy spacer 144 is also removed. The removal of portions of the shallow trench isolation 120 and the inner dummy spacer 144 is selective to the gate spacer 154, so that at least a substantial portion of the gate spacer 154 is preserved after the removal of the inner dummy spacer 144.

The gate spacer 154 and the remaining portion of the pad layer 140 constitute a dielectric spacer 156 that laterally abuts all sidewalls of the gate electrode (170, 172). Preferably, the shallow trench isolation 120 is recessed below top surfaces of the first conductivity type region 32 and the second conductivity type region 134.

A gate length Lg herein refers to the dimension between inner sidewalls of the dielectric spacer 156 that are parallel to the interface between the first conductivity type region 132 and the second conductivity type region 134. The gate length Lg is substantially equal to the preliminary gate length Lgp, and differs from the preliminary gate length Lgp by the amount of lateral etch of the gate spacer 154, which is minimal. The gate length Lg may be, and preferably is, sublithographic, i.e., less than a minimal dimensions that is printable with lithographic techniques. For example, the gate length Lg may be from about 6 nm to about 120 nm, and preferably from about 10 nm to about 40 nm.

The gate electrode (170, 172) overlies a portion of the first conductivity type region 132 and a portion of the second conductivity type region 134. The length of the overlap between the gate electrode (170, 172) and the first conductivity type region 132, i.e., the dimension between a sidewall of the gate electrode (170, 172) above the first conductivity type region 132 and the interface between the first conductivity type region 132 and the second conductivity type region 34, is herein referred to as a first overlap length OL1. Likewise, the length of the overlap between the gate electrode (170, 172) and the second conductivity type region 134, i.e., the dimension between a sidewall of the gate electrode (170, 172) above the second conductivity type region 134 and the interface between the first conductivity type region 132 and the second conductivity type region 134, is herein referred to as a second overlap length OL2. The sum of the first overlap length OL1 and the second overlap length OL2 is the same as the gate length Lg. In one embodiment, doses and tilt angles of the first angled ion implantation and the second angled ion implantation are adjusted so that the diffusion lengths of the dopant ions in the first conductivity type region 132 and the second conductivity type region 134 are equal. In this case, the first overlap length OL1 and the second overlap length OL2 are the same and are equal to one half of the gate length Lg.

Figure 31:
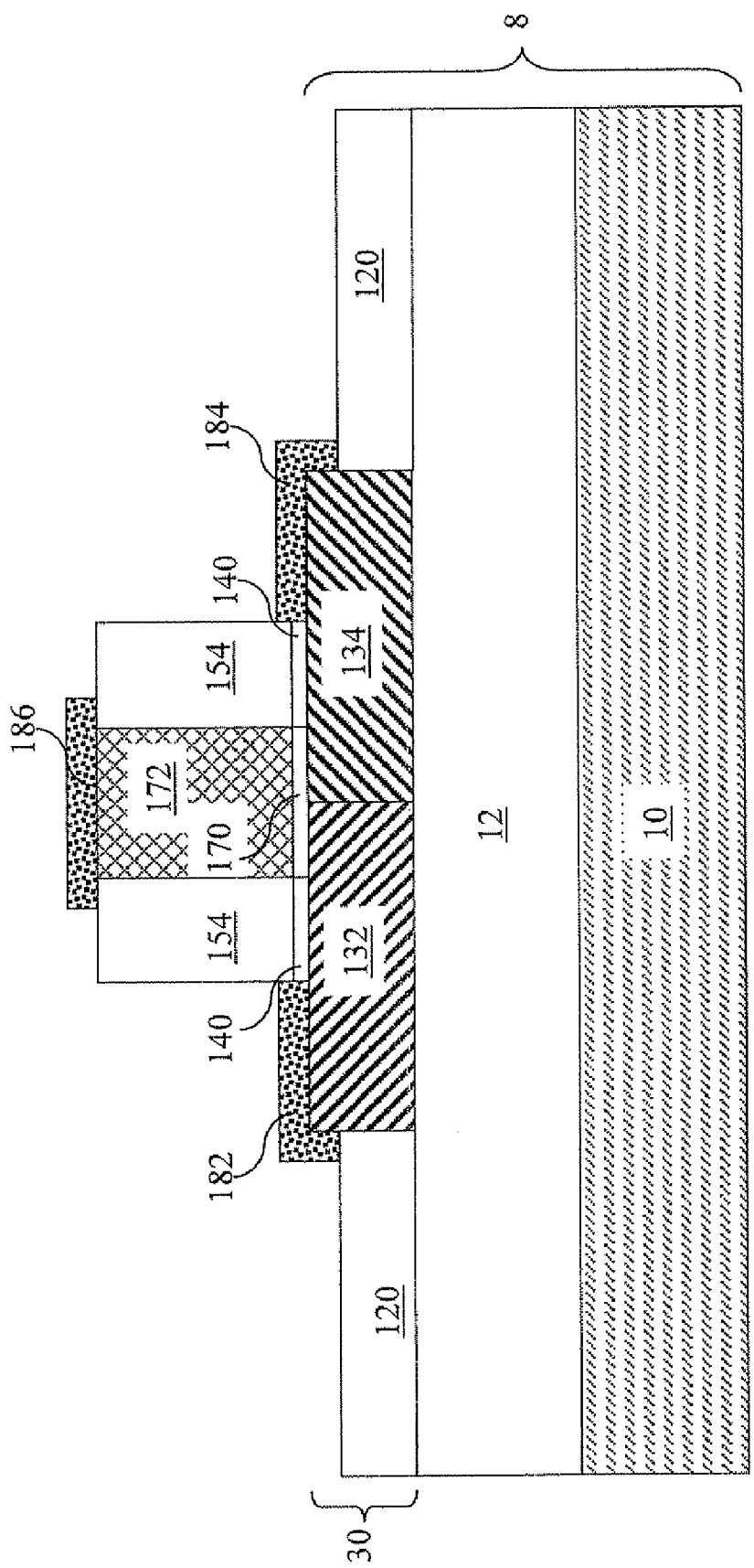

Referring to FIG. 31, various metal semiconductor alloys are formed by metallization of exposed semiconductor surfaces. Specifically, a first metal semiconductor alloy 182 is formed on the first conductivity type region 132, and a second metal semiconductor alloy 184 is formed on the second conductivity type region 134. In case the gate conductor 172 comprises a semiconductor material that may form a metal semiconductor alloy, a gate metal semiconductor alloy 186 may be formed on the gate conductor 172. In case the gate conductor 172 comprises elemental metal, formation of a gate metal semiconductor alloy may be omitted. Each of the first and second metal semiconductor alloys (182, 184) has a horizontal portion that laterally abut a top surface of one of the first and second conductivity type regions (132, 134) and an edge portion that abut the shallow trench isolation 120.

Figure 32:
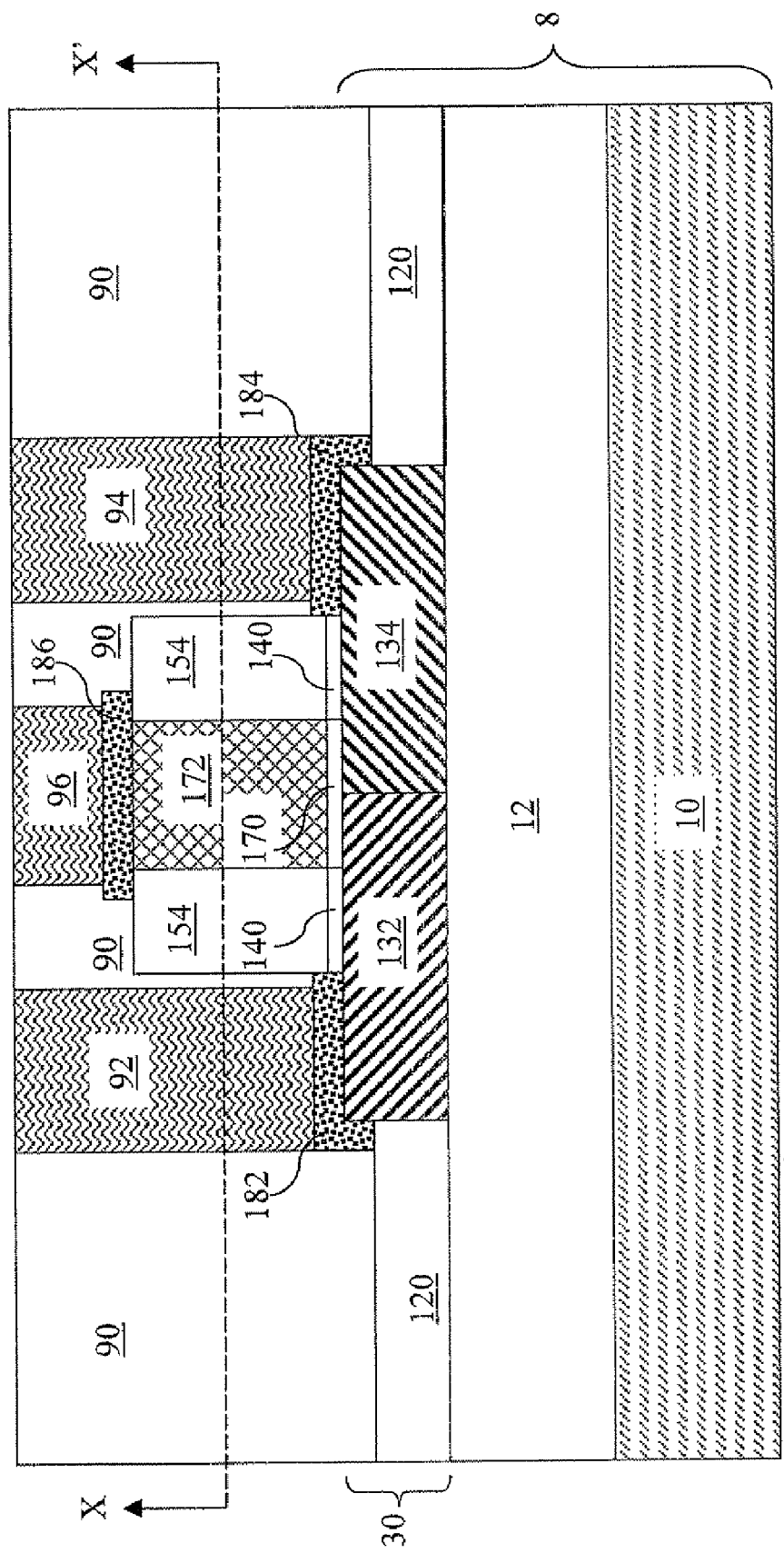
Figure 33:
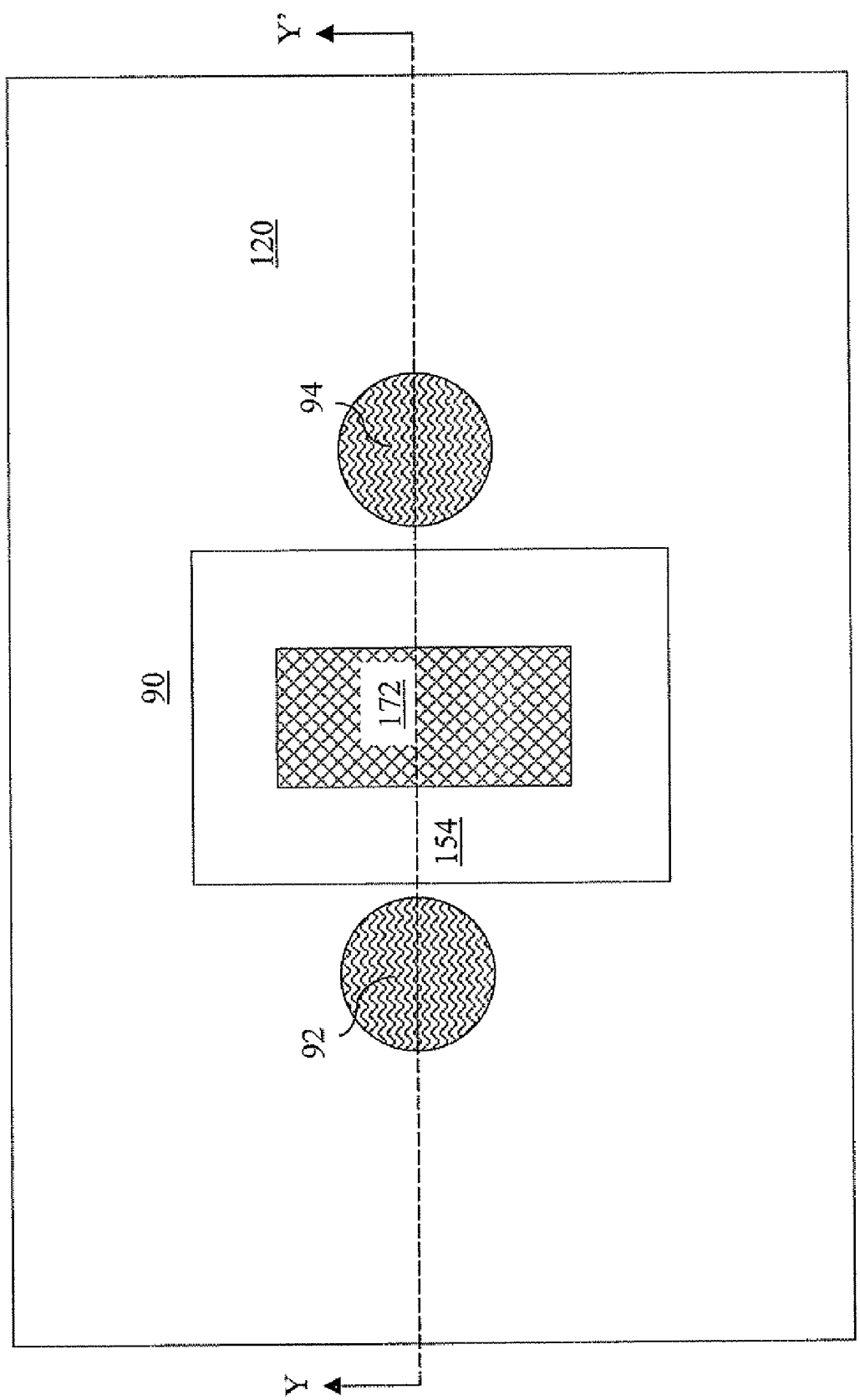

Referring to FIGS. 32 and 33, a middle-of-line (MOL) dielectric layer 90 is formed on the various metal semiconductor alloys (182, 184, 186), the shallow trench isolation 120, and the gate spacer 154. The MOL dielectric layer 90 may comprise the same material as in the first exemplary semiconductor structure.

Contact via holes are formed in the MOL dielectric layer 90 and filled with metal to form various metal contacts. Specifically, a first metal contact via 92 is formed directly on the first metal semiconductor alloy 182, and a second metal contact via 94 is formed directly on the second metal semiconductor alloy 184. A gate contact via 96 is formed directly on the gate metal semiconductor alloy 186.

The interface between the first conductivity region 132 and the second conductivity region 134 constitutes a p-n junction, which is controlled by the gate electrode (170, 172). Interband tunneling of charge carriers is controlled by gate electrode (170, 172) in the second exemplary semiconductor structure, which is a second inventive tunneling effect transistor according to the present invention. The gate electrode (170, 172) is self-aligned to the p-n junction. Further, the gate electrode (170, 172) may have a sublithographic length, enabling a compact size, a high drive current per unit area, and a small parasitic capacitance.

Figure 34:
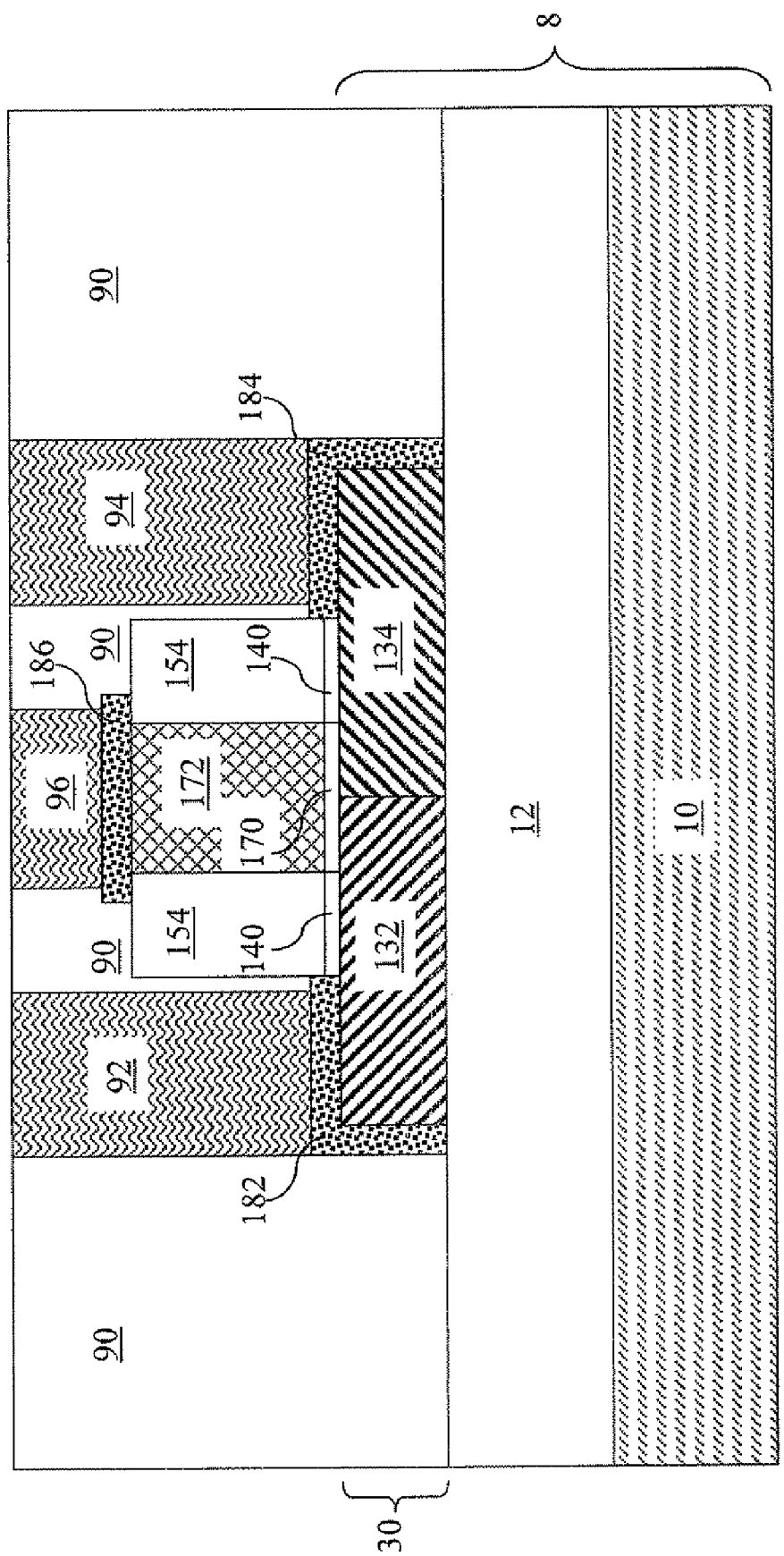
FIGS. 34-36 are vertical cross-sectional views of variations on the second exemplary semiconductor structure.

Referring to FIG. 34, a first variation on the second exemplary semiconductor is shown, in which the MOL dielectric layer 90 vertically abut the buried insulator layer 120. Shallow trench isolation 120 is removed concurrently or in sequence with the removal of the inner dummy spacer 144. The first metal semiconductor alloy 182 laterally abuts the sidewalls of the first conductivity type region 132 and vertically abuts the buried insulator layer 12. Likewise, the second metal semiconductor alloy 184 laterally abuts the sidewalls of the second conductivity type region 134 and vertically abuts the buried insulator layer 12. The first metal contact via 92 vertically abuts a horizontal portion of the first metal semiconductor alloy 182. Likewise, the second metal contact via 94 vertically abuts a horizontal portion of the second metal semiconductor alloy 184.

Figure 35:
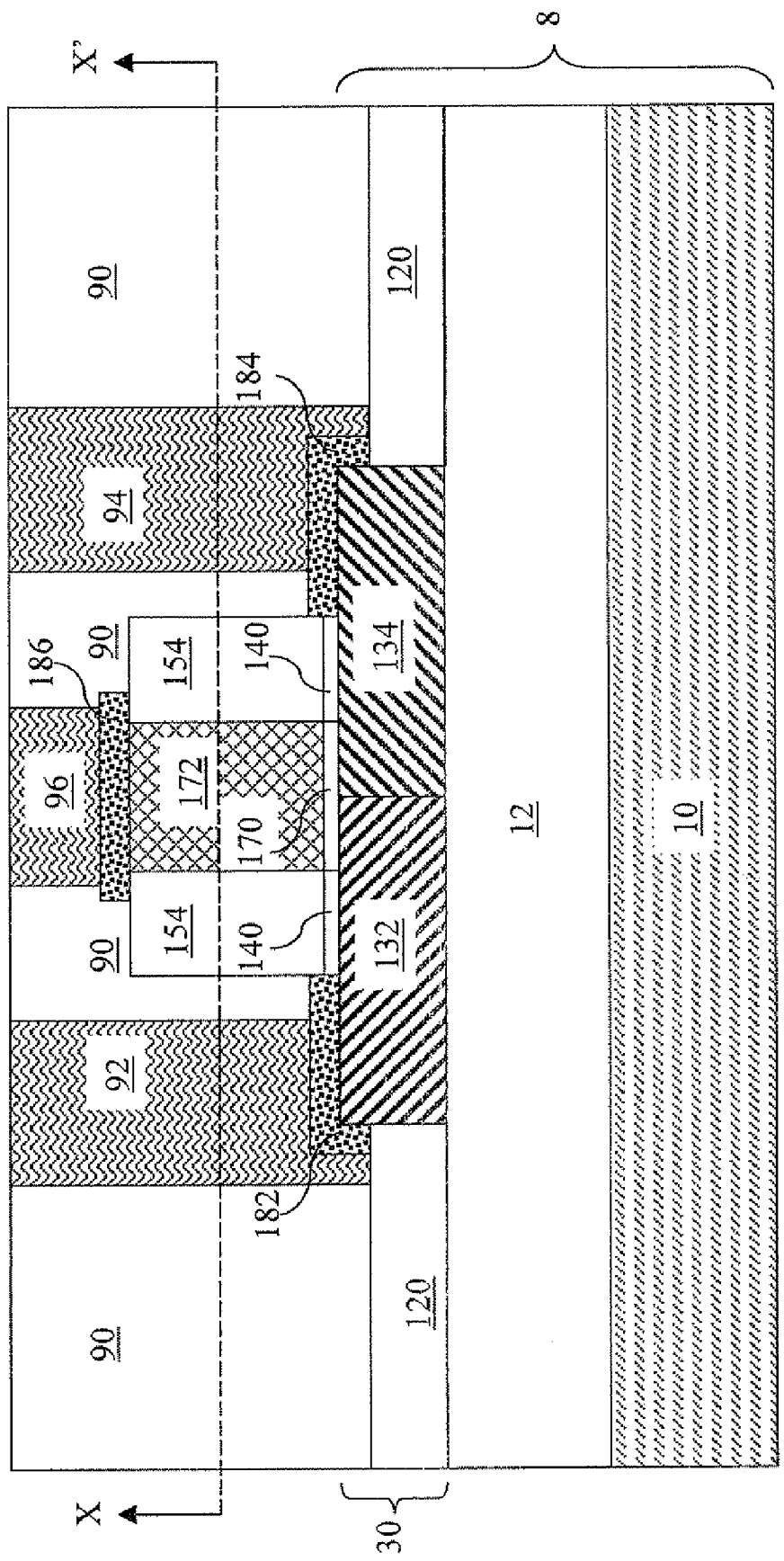

Referring to FIG. 35, a second variation on the second exemplary semiconductor structure is shown, in which the first metal contact via 92 and the second metal contact via 94 are farther away from the gate electrode (170, 172) than the second semiconductor structure in FIGS. 32 and 33. The first metal contact via 92 contacts the first metal semiconductor alloy 182 and the shallow trench isolation 120, and the second metal contact via 94 contacts the second metal semiconductor alloy 184 and the shallow trench isolation 120.

Figure 36:
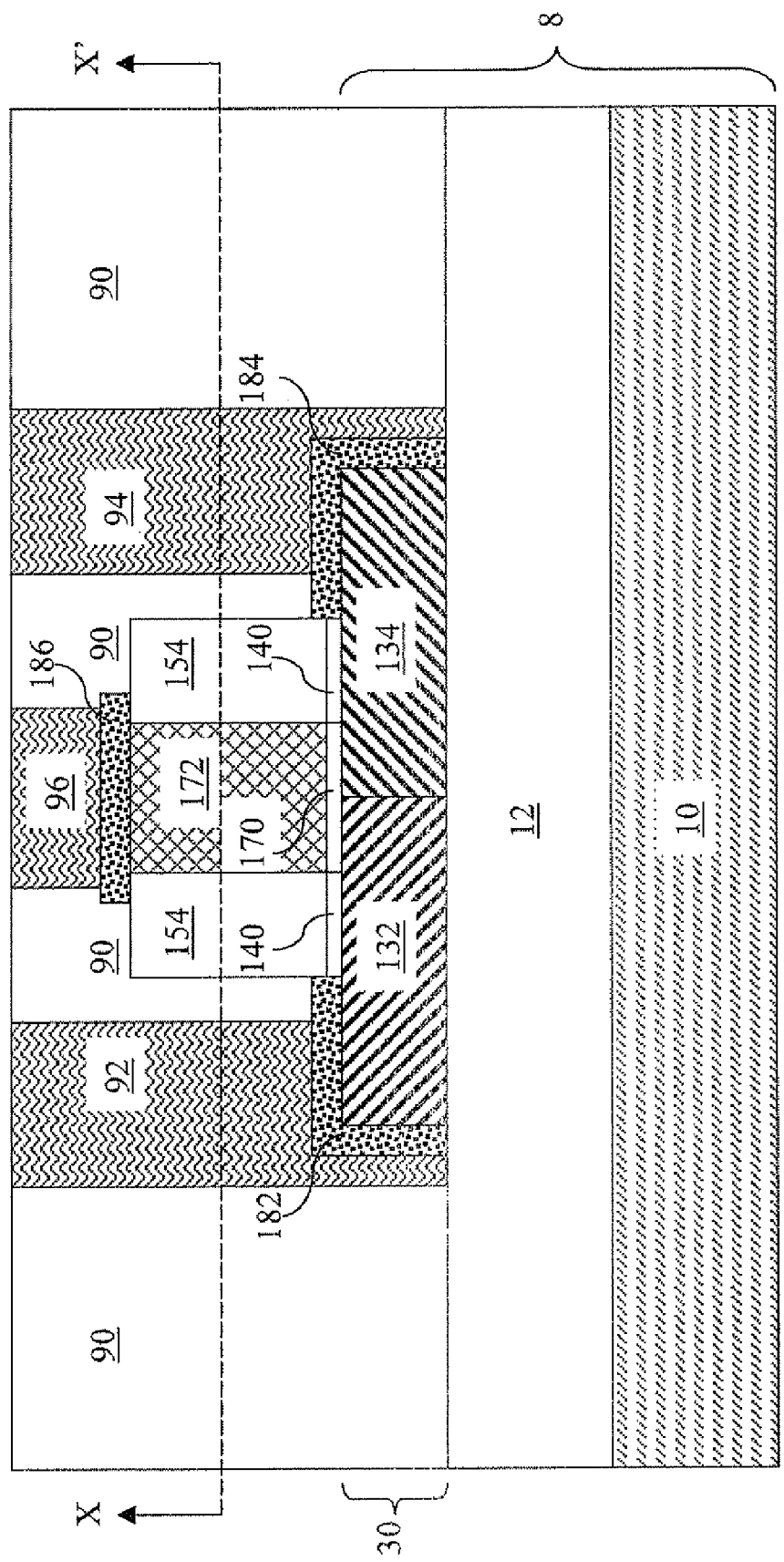

Referring to FIG. 36, a third variation on the second exemplary semiconductor structure is shown, in which the MOL dielectric layer 90 vertically abut the buried insulator layer 120 and the first metal contact via 92 and the second metal contact via 94 are farther away from the gate electrode (170, 172) than the second semiconductor structure in FIGS. 32 and 33. The first metal contact via 92 contacts the first metal semiconductor alloy 182 and the buried insulator layer 12, and the second metal contact via 94 contacts the second metal semiconductor alloy 184 and the buried insulator layer 12. Further, the first metal semiconductor alloy 182 vertically abuts the buried insulator layer 12, and the second metal semiconductor alloy 184 vertically abuts the buried insulator layer 12.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A method of manufacturing a semiconductor structure comprising:

forming a mandrel on a semiconductor region in a semiconductor substrate;

forming an outer dummy spacer on sidewalls of said mandrel, wherein a portion of said semiconductor region is located outside said mandrel and said outer dummy spacer;

forming a first conductivity type region in said portion of said semiconductor region;

removing said mandrel to form a recessed region and forming a second conductivity type region underneath said recessed region; and removing said outer dummy spacer and forming a gate electrode comprising a gate dielectric and a gate conductor directly on said first conductivity type region and said second conductivity type region.

2. The method of claim 1, further comprising performing an anneal so that said first conductivity type region and said second conductivity type region abut each other by diffusion, wherein said gate electrode is self-aligned to an interface between said first conductivity type region and the second conductivity type region.

3. The method of claim 1, wherein a lateral thickness of said outer dummy spacer is a sublithographic dimension, and wherein a length of said gate electrode is another sublithographic dimension.

4. The method of claim 1, further comprising:

forming at least one planarization dielectric layer on said first conductivity type region;

planarizing said at least one planarization dielectric layer;

forming at least one replacement dielectric layer on said second conductivity type region; and planarizing said at least one replacement dielectric layer.

5. The method of claim 4, further comprising forming a first dielectric spacer and a second dielectric spacer, wherein said first dielectric spacer comprises a stack of a first planarization dielectric layer and a second planarization dielectric layer, and said second dielectric spacer comprises a stack of a first replacement dielectric layer and a second replacement dielectric layer, and wherein a vertical portion of said first planarization dielectric layer and a vertical portion of said first replacement dielectric layer are removed after said removing of said outer dummy spacer and prior to said forming of said gate electrode.

* * * * *